(12) United States Patent
Yamaguchi et al.

(10) Patent No.: US 9,235,092 B2
(45) Date of Patent: Jan. 12, 2016

(54) ACTIVE MATRIX SUBSTRATE AND DISPLAY PANEL INCLUDING THE SAME

(71) Applicant: Sharp Kabushiki Kaisha, Osaka-shi, Osaka (JP)

(72) Inventors: Takahiro Yamaguchi, Osaka (JP); Shige Furuta, Osaka (JP); Makoto Yokoyama, Osaka (JP); Shuji Nishi, Osaka (JP); Yohsuke Fujikawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/377,601

(22) PCT Filed: Mar. 14, 2013

(86) PCT No.: PCT/JP2013/001696
§ 371 (c)(1),
(2) Date: Aug. 8, 2014

(87) PCT Pub. No.: WO2013/140760
PCT Pub. Date: Sep. 26, 2013

(65) Prior Publication Data
US 2015/0022770 A1  Jan. 22, 2015

(30) Foreign Application Priority Data

Mar. 21, 2012  (JP) ................................. 2012-063773

(51) Int. Cl.
*G02F 1/1362* (2006.01)
*H01L 27/12* (2006.01)
(Continued)

(52) U.S. Cl.
CPC ...... *G02F 1/136286* (2013.01); *G02F 1/13452* (2013.01); *G02F 1/13454* (2013.01); *G09F 9/30* (2013.01); *H01L 27/124* (2013.01); *G02F 2001/13456* (2013.01); *G09G 3/3688* (2013.01); *G09G 2300/0408* (2013.01)

(58) Field of Classification Search
CPC .............. G02F 1/1345; G02F 1/13452; G02F 1/13454; G02F 1/13458; G02F 2001/13456; H01L 27/124–27/1244; H01L 27/3276; H01L 27/3297
See application file for complete search history.

(56) References Cited

U.S. PATENT DOCUMENTS 5,951,304 A * 9/1999 Wildes ................ H01L 23/5386
439/67
2003/0022558 A1* 1/2003 Imaoka ............. H01L 23/49838
439/660

(Continued)

FOREIGN PATENT DOCUMENTS

WO   2008/053622 A1   5/2008

OTHER PUBLICATIONS

Official Communication issued in International Patent Application No. PCT/JP2013/001696, mailed on Jun. 18, 2013.

*Primary Examiner* — Mariceli Santiago
(74) *Attorney, Agent, or Firm* — Keating & Bennett, LLP

(57) ABSTRACT

In a region extending along a terminal region located near a substrate end and included in a frame region defined around a rectangular display region, a peripheral circuit section is provided between the display region and a mount region defined in part of the terminal region. The peripheral circuit section includes unit circuit sections that are monolithically provided and are aligned along one side of the display region. The arrangement pitch of outer ones of the unit circuit sections is larger than that of inner ones of the unit circuit sections.

13 Claims, 17 Drawing Sheets

(51) Int. Cl.
  *G02F 1/1345* (2006.01)
  *G09F 9/30* (2006.01)
  *G09G 3/36* (2006.01)

(56) References Cited

U.S. PATENT DOCUMENTS

2003/0043104 A1\* 3/2003 Lee .................. G02F 1/1345
                                                    345/92
2004/0012744 A1\* 1/2004 Ishige ................ G02F 1/1345
                                                    349/139
2004/0183484 A1\* 9/2004 Ide ..................... G02F 1/13452
                                                    315/366
2007/0222777 A1\* 9/2007 Nakazawa ........... G02F 1/1345
                                                    345/205
2012/0146972 A1\* 6/2012 Fujikawa ............ G02F 1/13454
                                                    345/206

\* cited by examiner

ACTIVE MATRIX SUBSTRATE AND DISPLAY PANEL INCLUDING THE SAME

TECHNICAL FIELD

The present invention relates to active matrix substrates and display panels including active matrix substrates, and particularly to a technique for narrowing a frame in an active matrix substrate with a three-side-free structure and a display panel including such an active matrix substrate.

BACKGROUND ART

In recent years, display panels such as liquid crystal display panels are used for various types of electronic equipment. In particular, electronic equipment for mobile use, such as cellular phones, needs to narrow a frame region at the outer periphery of a display screen, i.e., needs to narrow the frame and, thereby, to reduce the size of the electronic equipment.

A liquid crystal display panel of an active matrix drive type includes an active matrix substrate and a counter substrate that are opposed to each other, and a liquid crystal layer sandwiched between the active matrix substrate and the counter substrate. The active matrix substrate includes, in a rectangular display region corresponding to the above-described display screen, a plurality of gate signal lines extending in parallel with one another and a plurality of source signal lines extending in parallel with one another in a direction orthogonal to the gate signal lines. The active matrix substrate has a terminal region on its surface projecting from the counter substrate.

In order to reduce the device size and the number of components, typical mobile electronic equipment including a display panel of an active matrix drive type has a so-called "three-side-free structure" in which a terminal region is disposed only on one of the four sides of an active matrix substrate and no terminal regions are disposed on the other three sides. On the active matrix substrate with the three-side-free structure, one gate control circuit is monolithically provided along each of the two opposed sides on which no terminal regions are disposed, one source control circuit is monolithically provided on one side on which the terminal region is disposed, and a driver integrated circuit (IC) connected to the gate control circuits and the source control circuit is mounted, for example. The gate control circuits are connected to gate signal lines. The source control circuit is connected to source signal lines. The source control circuit includes, for every three adjacent source signal lines, a demultiplexer circuit for splitting display source signals from video signal lines connected to the driver IC to color elements of RGB, an inspection circuit for inputting an inspection signal to the demultiplexer circuit, and a protection circuit for protecting the demultiplexer circuit, the inspection circuit, and thin film transistors (TFTs) provided in subpixels, which are minimum units of an image, for example.

For example, Patent Document 1 describes that a device substrate with a three-side-free structure can be designed such that an RGB switch circuit corresponding to the above-described demultiplexer circuit and a protection circuit for video signals are separated from each other and the pitch of arrangement in the protection circuit for video signals is smaller than that in the RGB switch circuit. This design is intended to reduce the size of the frame region of the substrate by creating a redundant region for disposing circuits, such as a protection circuit for general-purpose signals, and lines near both ends of components arranged in the protection circuit for video signal lines.

CITATION LIST

Patent Document

PATENT DOCUMENT 1: International Patent Publication No. WO2008/053622 (FIG. 1)

SUMMARY OF THE INVENTION

Technical Problem

In the device substrate described in Patent Document 1, however, a plurality of lines (video signal lines) disposed between the protection circuit for video signals and the source driver IC are simply collected near the source driver IC, and thus, there is room for narrowing the frame.

It is therefore an object of the present invention to minimize the width of a frame region along a terminal region in an active matrix substrate with a three-side-free structure.

Solution to the Problem

To achieve the object, according to the present invention, the arrangement pitch of outer ones of unit circuit sections constituting a peripheral circuit section is larger than that of inner ones of the unit circuit sections.

Specifically, an active matrix substrate according to the present invention includes: a rectangular display region in which an image is to be displayed; a frame region defined around the display region; a terminal region included in the frame region, defined along one side of the display region, and located near an end of the substrate; a mount region included in the terminal region and defined along the side of the display region; a plurality of signal lines located in the display region and extending in parallel with one another in a direction perpendicular to the side of the display region; a peripheral circuit section located in a portion of the frame region between the display region and the mount region and including a plurality of unit circuit sections that are monolithically provided and are aligned along the side of the display region; a plurality of first lines located in a portion of the frame region between the display region and the peripheral circuit section and having an outline that narrows from the signal lines toward the unit circuit sections; and a plurality of second lines located in a portion of the frame region between the peripheral circuit section and the mount region and having an outline that narrows from the unit circuit sections toward the mount region, and an arrangement pitch of outer ones of the unit circuit sections is larger than that of inner ones of the unit circuit sections.

In this configuration, in the region extending along the terminal region near the substrate end and included in the frame region defined around the rectangular display region, the peripheral circuit section is provided between the display region and the mount region that is a part of the terminal region. In the peripheral circuit section, the monolithically provided unit circuit sections are aligned along one side of the display region. The arrangement pitch of the outer unit circuit sections is larger than that of the inner unit circuit sections. Thus, suppose the length of the peripheral circuit section along one side of the display region is common and the number of unit circuit sections included in the peripheral circuit section is common, for example, then the narrowing of the outline of the entire second lines becomes gentle, i.e., the angle formed by the outermost second line with the side of the display region is reduced, as compared to a case where the arrangement pitches of the unit circuit sections are uniform at an average value. In this manner, the length of the outline of the entire second lines in a direction perpendicular to the side of the display region can be reduced. As a result, the width of the frame region along the terminal region can be minimized in the active matrix substrate with the three-side-free structure.

The active matrix substrate may further include a demultiplexer circuit section located in a portion of the frame region between the display region and the peripheral circuit section and including a plurality of first unit circuits that are monolithically provided for each predetermined number of adjacent ones of the signal lines and are aligned along the side of the display region. In this case, the first unit circuits are connected to the predetermined number of adjacent ones of the signal lines, the unit circuit sections are a plurality of second unit circuits individually connected to the first unit circuits through the first lines, the first lines are a plurality of first video signal lines that are arranged in a portion of the frame region between the demultiplexer circuit section and the peripheral circuit section such that an outline of the first video signal lines narrows from the first unit circuits toward the second unit circuits, and the second lines are a plurality of second video signal lines.

The signal lines may be a plurality of source signal lines.

Specifically, an active matrix substrate according to the present invention includes:

a rectangular display region in which an image is to be displayed;

a frame region defined around the display region;

a terminal region included in the frame region, defined along one side of the display region, and located near an end of the substrate;

a mount region included in the terminal region and defined along the side of the display region;

a plurality of source signal lines located in the display region and extending in parallel with one another in a direction perpendicular to the side of the display region;

a demultiplexer circuit section located in a portion of the frame region between the display region and the mount region and including a plurality of first unit circuits that are monolithically provided for, and are connected to, each predetermined number of adjacent ones of the source signal lines and are aligned along the side of the display region;

a peripheral circuit section located in a portion of the frame region between the demultiplexer circuit section and the mount region and including a plurality of second unit circuits that are monolithically provided, individually connected to the first unit circuits, and aligned along the side of the display region;

a plurality of first video signal lines that are arranged in a portion of the frame region between the demultiplexer circuit section and the peripheral circuit section such that an outline of the first video signal lines narrows from the first unit circuits toward the second unit circuits; and a plurality of second video signal lines that are arranged in a portion of the frame region between the peripheral circuit section and the mount region such that an outline of the second video signal lines narrows from the second unit circuits toward the mount region, and an arrangement pitch of outer ones of the second unit circuits is larger than that of inner ones of the second unit circuits.

In this configuration, in the region extending along the terminal region near the substrate end and included in the frame region defined around the rectangular display region, the peripheral circuit section is provided between the demultiplexer circuit section near the display region and the mount region that is a part of the terminal region. In the peripheral circuit section, the monolithically provided second unit circuits are aligned along one side of the display region. The arrangement pitch of the outer second unit circuits is larger than that of the inner second unit circuits. Thus, suppose the length of the peripheral circuit section along one side of the display region is common and the number of second unit circuits included in the peripheral circuit section is common, for example, then the narrowing of the outline of the entire second video signal lines becomes gentle, i.e., the angle formed by the outermost second video signal line with the side of the display region is reduced, as compared to a case where the arrangement pitches of the second unit circuits are uniform at an average value. In this manner, the length of the outline of the entire second video signal lines in a direction perpendicular to the side of the display region can be reduced. As a result, the width of the frame region along the terminal region can be minimized in the active matrix substrate with the three-side-free structure.

Each of the second unit circuits may include at least one of an inspection circuit for inputting an inspection signal to an associated one of the first unit circuits or a protection circuit for protecting at least an associated one of the first unit circuits.

In this configuration, since each of the second unit circuits includes an inspection circuit and/or a protection circuit, an active matrix substrate in which each second unit circuit includes an inspection circuit and a protection circuit, an active matrix substrate in which each second unit circuit includes an inspection circuit, or an active matrix substrate in which each second unit circuit includes a protection circuit is obtained.

A length of the peripheral circuit section along the side of the display region may be smaller than a length of the demultiplexer circuit section along the side of the display region.

In this configuration, since the length of the peripheral circuit section along one side of the display region is smaller than the length of the demultiplexer circuit section along the side of the display region, it is possible to obtain a sufficient space for disposing other circuits and lines, such as a level shift circuit, a buffer circuit, a protection circuit for a general signal, a control signal line for a demultiplexer circuit, and a protection circuit for the control signal, near the both ends of the peripheral circuit section.

Another active matrix substrate according to the present invention includes: a rectangular display region in which an image is to be displayed; a frame region defined around the display region; a terminal region included in the frame region, defined along one side of the display region, and located near an end of the substrate; a mount region included in the terminal region and defined along the side of the display region; a plurality of signal lines located in the display region and extending in parallel with one another in a direction perpendicular to the side of the display region; a first peripheral circuit section located in a portion of the frame region between the display region and the mount region and including a plurality of first unit circuit sections that are monolithically provided and are aligned along the side of the display region; a second peripheral circuit section located in a portion of the frame region between the first peripheral circuit section and the mount region and including a plurality of second unit circuit sections that are monolithically provided, are individually connected to the first unit circuit sections, and are aligned along the side of the display region; a plurality of first lines located in a portion of the frame region between the display region and the first peripheral circuit section and having an outline that narrows from the signal lines toward the first unit circuit sections; a plurality of second lines located in a portion of the frame region between the first peripheral circuit section and the second peripheral circuit section and having an outline that narrows from the first unit circuit sections toward the second unit circuit sections; and a plurality of third lines located in a portion of the frame region between the second peripheral circuit section and the mount region and having an outline that narrows from the second unit circuit sections toward the mount region, and an arrangement pitch of outer ones of the first unit circuit sections is larger than that of inner ones of the first unit circuit sections, and/or an arrangement pitch of outer ones of the second unit circuit sections is larger than that of inner ones of the second unit circuit sections.

In this configuration, in the region extending along the terminal region near the substrate end and included in the frame region defined around the rectangular display region, the first peripheral circuit section and the second peripheral circuit section are provided between the display region and the mount region that is a part of the terminal region. In the first peripheral circuit section and the second peripheral circuit section, the monolithically provided first unit circuit sections and the monolithically provided second unit circuit sections are aligned along one side of the display region. The arrangement pitch of the outer first unit circuits is larger than that of the inner first unit circuits, and/or the arrangement pitch of the outer second unit circuits is larger than that of the inner second unit circuits. Thus, suppose the length of the first peripheral circuit section along one side of the display region is common, the number of first unit circuit sections included in the first peripheral circuit section is common, the length of the second peripheral circuit section along one side of the display region is common, and the number of second unit circuit sections included in the second peripheral circuit section is common, for example, then the narrowing of the outline of the entire second and/or third lines becomes gentle, i.e., the angle formed by the outermost second and/or third line with the side of the display region is reduced, as compared to a case where the arrangement pitches of the first and second unit circuit sections are uniform at an average value. In this manner, the length of the outline of the entire second and/or third lines in a direction perpendicular to the side of the display region can be reduced. As a result, the width of the frame region along the terminal region can be minimized in the active matrix substrate with the three-side-free structure.

The active matrix substrate may further include: a demultiplexer circuit section located in a portion of the frame region between the display region and the first peripheral circuit section and including a plurality of first unit circuits that are monolithically provided for each predetermined number of adjacent ones of the signal lines and are aligned along the side of the display region. In this case, the first unit circuits are connected to the predetermined number of adjacent ones of the signal lines, the first unit circuit sections are a plurality of second unit circuits individually connected to the first unit circuits through the first lines, the second unit circuit sections are a plurality of third unit circuits individually connected to the second unit circuits through the second lines, the first lines are a plurality of first video signal lines that are arranged in a portion of the frame region between the demultiplexer circuit section and the first peripheral circuit section such that an outline of the first video signal lines narrows from the first unit circuits toward the second unit circuits, the second lines are a plurality of second video signal lines that are arranged in a portion of the frame region between the first peripheral circuit section and the second peripheral circuit section such that an outline of the second video signal lines narrows from the second unit circuits toward the third unit circuits, and the third lines are a plurality of third video signal lines.

The signal lines may be a plurality of source signal lines.

Specifically, the active matrix substrate according to the present invention further includes:

a rectangular display region in which an image is to be displayed;

a frame region defined around the display region;

a terminal region included in the frame region, defined along one side of the display region, and located near an end of the substrate;

a mount region included in the terminal region and defined along the side of the display region;

a plurality of source signal lines located in the display region and extending in parallel with one another in a direction perpendicular to the side of the display region;

a demultiplexer circuit section located in a portion of the frame region between the display region and the mount region and including a plurality of first unit circuits that are monolithically provided for, and are connected to, each predetermined number of adjacent ones of the source signal lines and are aligned along the side of the display region;

a first peripheral circuit section located in a portion of the frame region between the demultiplexer circuit section and the mount region and including a plurality of second unit circuits that are monolithically provided, individually connected to the first unit circuits, and aligned along the side of the display region;

a second peripheral circuit section located in a portion of the frame region between the first peripheral circuit section and the mount region and including a plurality of third unit circuits that are monolithically provided, individually connected to the second unit circuits, and aligned along the side of the display region;

a plurality of first video signal lines that are arranged in a portion of the frame region between the demultiplexer circuit section and the first peripheral circuit section such that an outline of the first video signal lines narrows from the first unit circuits toward the second unit circuits;

a plurality of second video signal lines that are arranged in a portion of the frame region between the first peripheral circuit section and the second peripheral circuit section such that an outline of the second video signal lines narrows from the second unit circuits toward the third unit circuits; and a plurality of third video signal lines that are arranged in a portion of the frame region between the second peripheral circuit section and the mount region such that an outline of the third video signal lines narrows from the third unit circuits toward the mount region, and an arrangement pitch of outer ones of the second unit circuits is larger than that of inner ones of the second unit circuits, and/or an arrangement pitch of outer ones of the third unit circuits is larger than that of inner ones of the third unit circuits.

In this configuration, in the region extending along the terminal region near the substrate end and included in the frame region defined around the rectangular display region, the first peripheral circuit section and the second peripheral circuit section are provided between the demultiplexer circuit section near the display region and the mount region that is a part of the terminal region. In the first peripheral circuit section and the second peripheral circuit section, the monolithically provided second unit circuits and/or third unit circuits are aligned along one side of the display region. The arrangement pitch of the outer second and/or third unit circuits is larger than that of the inner second and/or third unit circuits. Thus, suppose the length of the first peripheral circuit section along one side of the display region is common, the number of second unit circuits included in the first peripheral circuit section is common, the length of the second peripheral circuit section along one side of the display region is common, the number of third unit circuits included in the second peripheral circuit section is common, for example, then the narrowing of the outline of the entire second and/or third video signal lines becomes gentle, i.e., the angle formed by the outermost second and/or third video signal line with the side of the display region is reduced, as compared to a case where the arrangement pitches of the second and third unit circuits are uniform at an average value. In this manner, the length of the outline of the entire second and/or third video signal lines in a direction perpendicular to the side of the display region can be reduced. As a result, the width of the frame region along the terminal region can be minimized in the active matrix substrate with the three-side-free structure.

Each of the second unit circuits may be an inspection circuit for inputting an inspection signal to an associated one of the first unit circuits, and each of the third unit circuits may be a protection circuit for protecting at least an associated one of the first unit circuits.

In this configuration, since each of the second unit circuits is an inspection circuit and each of the third unit circuits is a protection circuit, an active matrix substrate in which the demultiplexer circuit section, the first peripheral circuit section including the inspection circuits, and the second peripheral circuit section including the protection circuits are arranged in this order from the display region side toward the mount region in the frame region along the terminal region is obtained.

Each of the second unit circuits may be a protection circuit for protecting at least an associated one of the first unit circuits, and each of the third unit circuits may be an inspection circuit for inputting an inspection signal to an associated one of the first unit circuits.

In this configuration, since each of the second unit circuits is a protection circuit and each of the third unit circuits is an inspection circuit, an active matrix substrate in which the demultiplexer circuit section, the first peripheral circuit section including the protection circuits, and the second peripheral circuit section including the inspection circuits are arranged in this order from the display region side toward the mount region in the frame region along the terminal region is obtained.

A length of the first peripheral circuit section along the side of the display region may be smaller than a length of the demultiplexer circuit section along the side of the display region, and may be larger than a length of the second peripheral circuit section along the side of the display region.

In this configuration, the length of the first peripheral circuit section along one side of the display region is smaller than the length of the demultiplexer circuit section along the side of the display region, and is larger than the length of the second peripheral circuit section along the side of the display region. Thus, it is possible to obtain a sufficient space for disposing other circuits and lines, such as a level shift circuit, a buffer circuit, a protection circuit for a general signal, a control signal line for a demultiplexer circuit, and a protection circuit for the control signal, near the both ends of each of the first peripheral circuit section and the second peripheral circuit section.

A display panel according to the present invention includes: one of the active matrix substrates described above; a counter substrate facing the active matrix substrate; and a display medium layer located between the active matrix substrate and the counter substrate.

In this configuration, the display panel includes the active matrix substrate with the three-side-free structure in which the width of the frame region along the terminal region can be minimized, the counter substrate facing the active matrix substrate, and the display medium layer sandwiched between these substrates. Thus, in a display panel including an active matrix substrate with a three-side-free structure, such as a liquid crystal display panel or an organic electro luminescence (EL) panel, the width of a frame region along a terminal region can be minimized.

The display medium layer may be a liquid crystal layer.

In this configuration, since the display medium layer is a liquid crystal layer, the liquid crystal display panel as a display panel is obtained.

Advantages of the Invention

In the present invention, since the arrangement pitch of outer ones of unit circuit sections constituting a peripheral circuit section is larger than that of inner ones of the unit circuit sections, the width of a frame region along a terminal region can be minimized in an active matrix substrate with a three-side-free structure.

DESCRIPTION OF EMBODIMENTS

Embodiments of the present invention will be described with reference to the drawings. The present invention is not limited to the following embodiments.

First Embodiment

Figure 1:
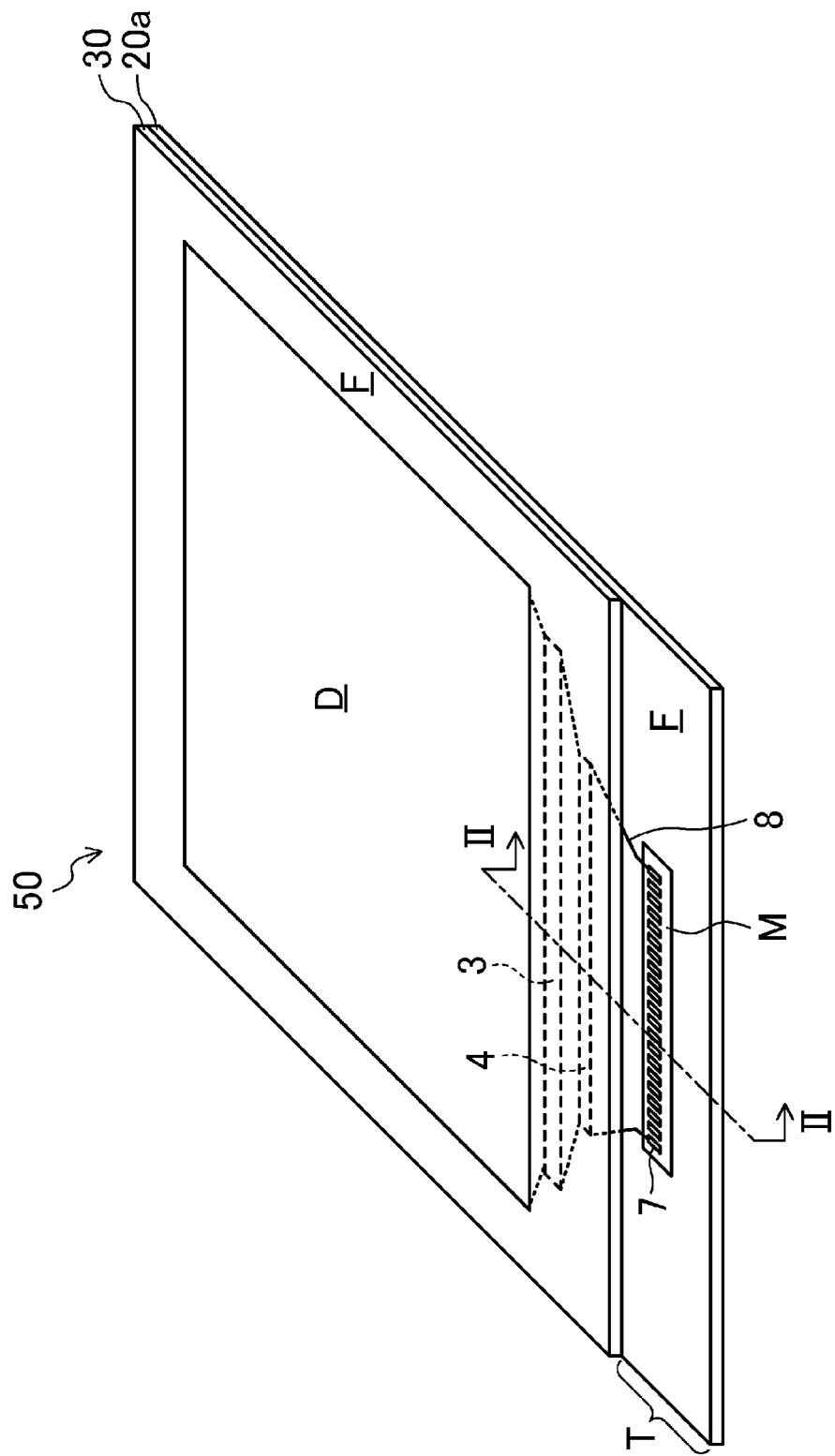
FIG. 1 is a perspective view illustrating a liquid crystal display panel according to a first embodiment.
Figure 2:
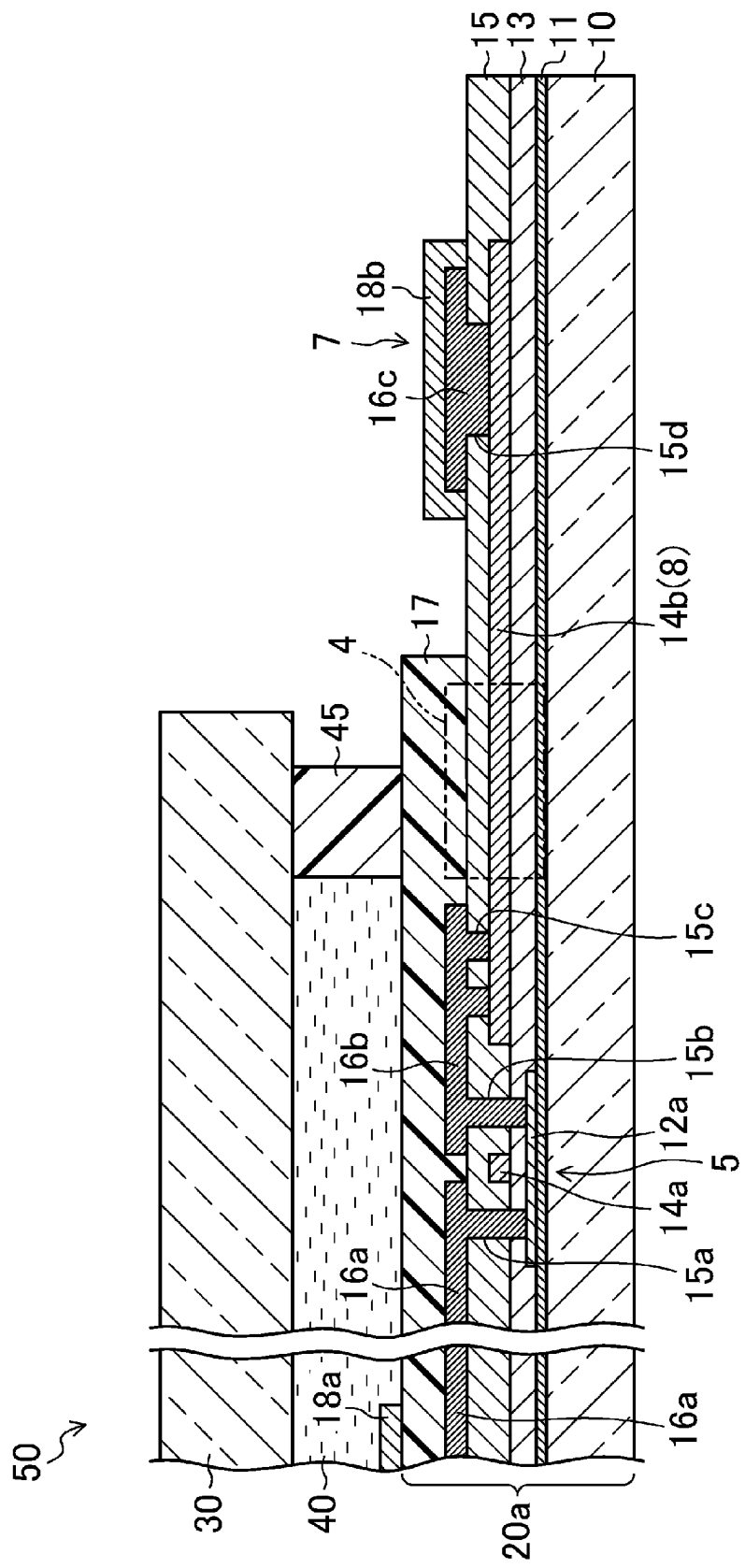
FIG. 2 is a cross-sectional view of the liquid crystal display panel taken along the line II-II in FIG. 1.
Figure 3:
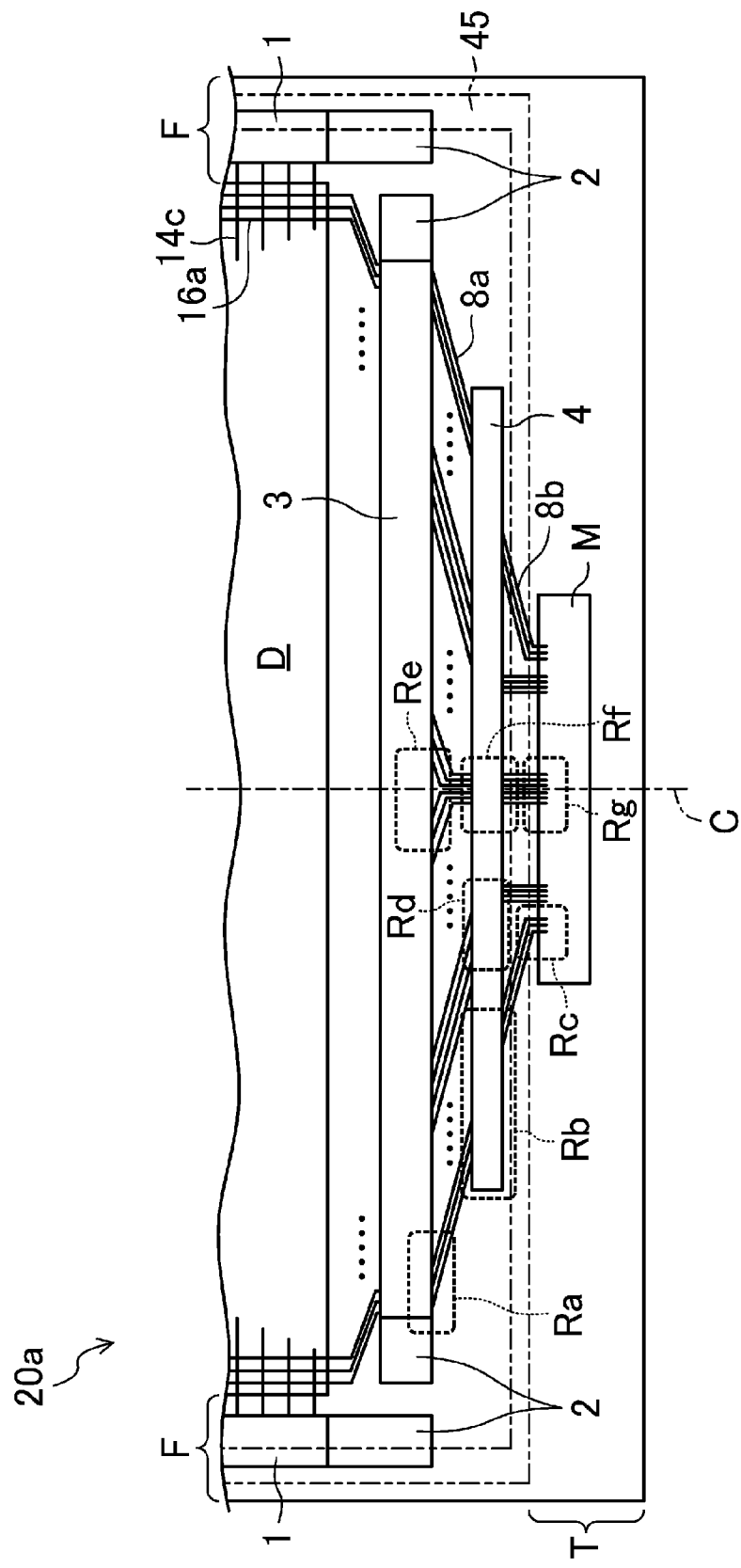
FIG. 3 is a plan view of an active matrix substrate constituting the liquid crystal display panel of the first embodiment.
Figure 11:
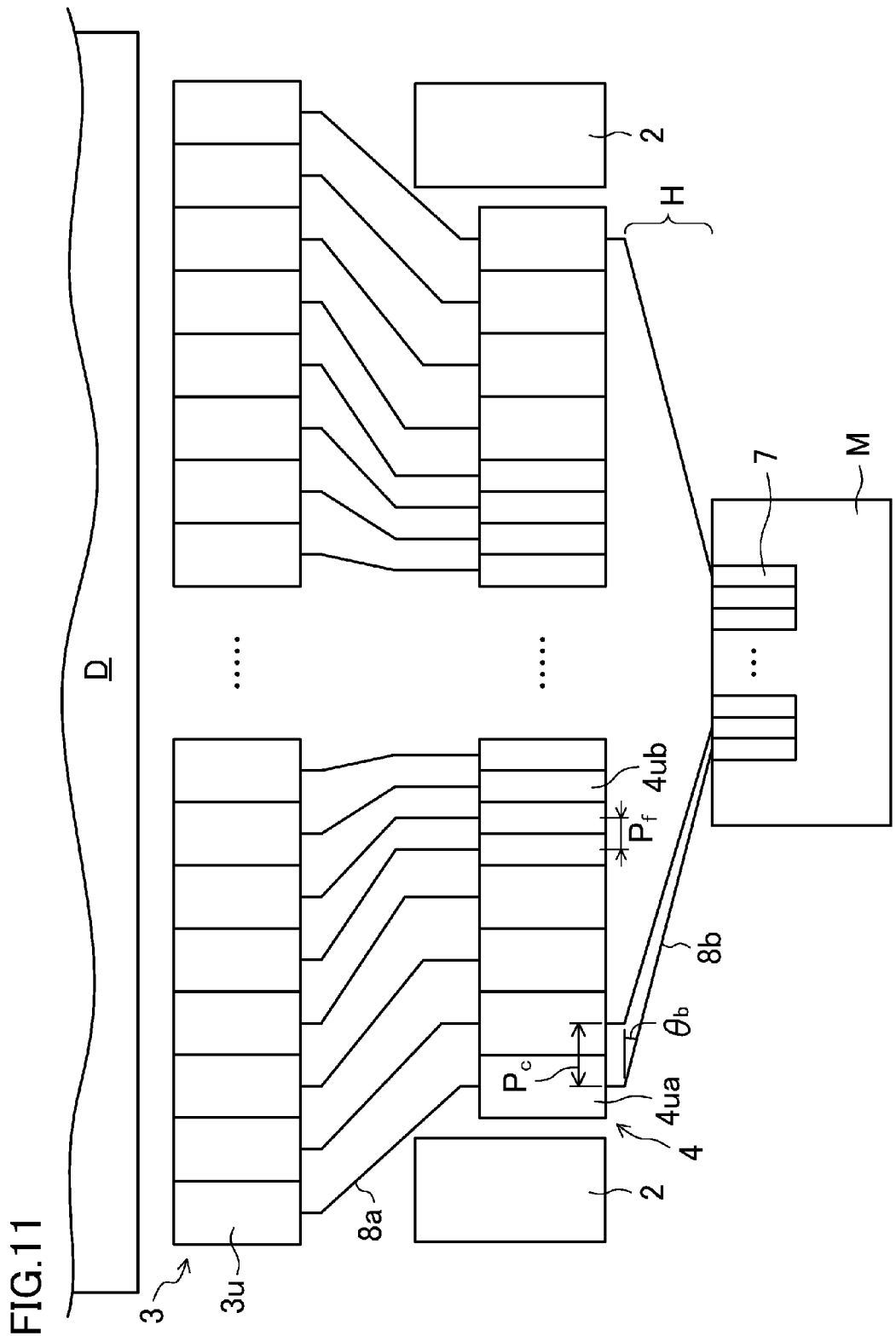
FIG. 11 is a plan view schematically illustrating features of the active matrix substrate of first embodiment.
Figure 12:
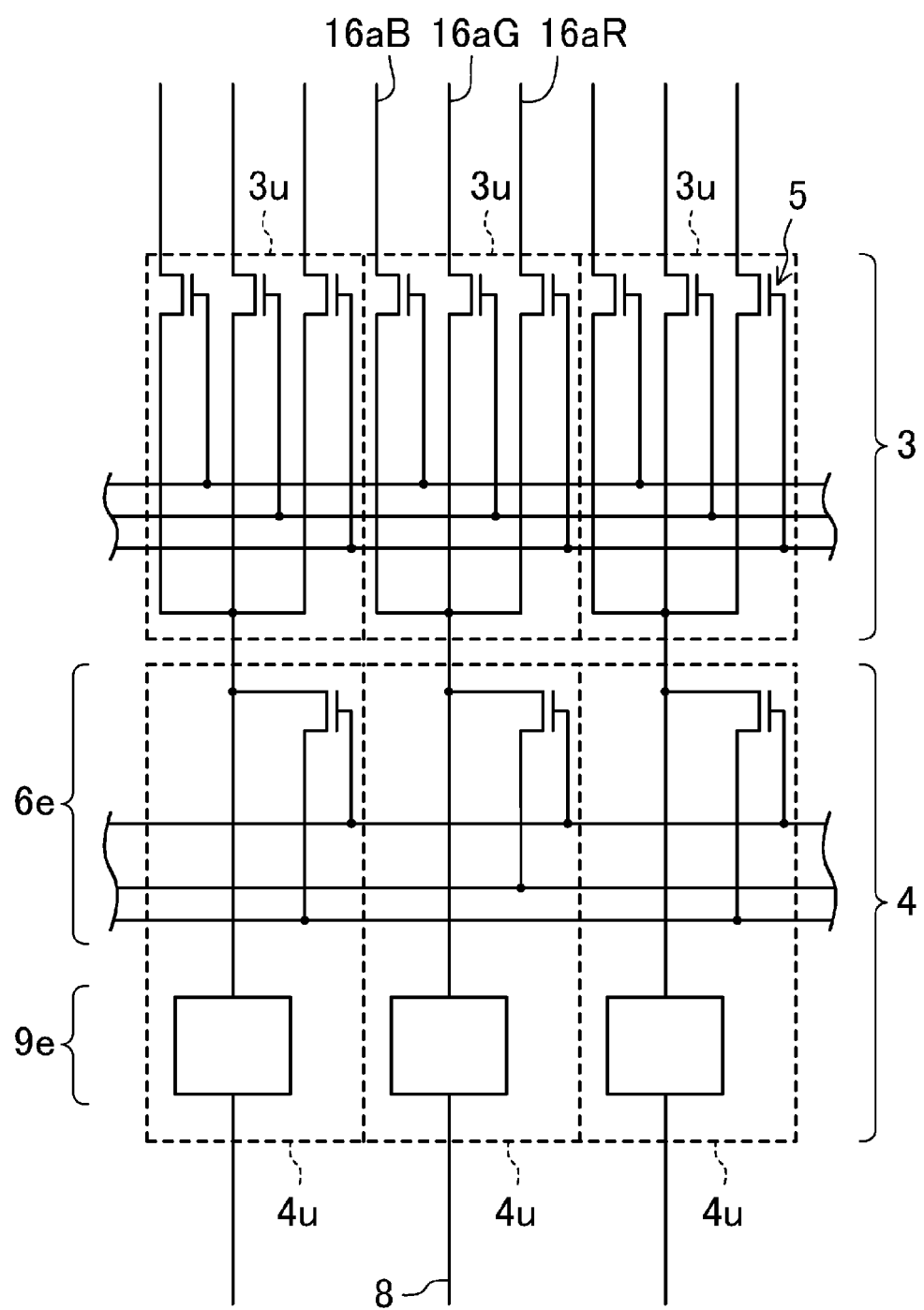
FIG. 12 is an equivalent circuit diagram of a demultiplexer circuit section and a peripheral circuit section constituting the active matrix substrate of the first embodiment.
Figure 13:
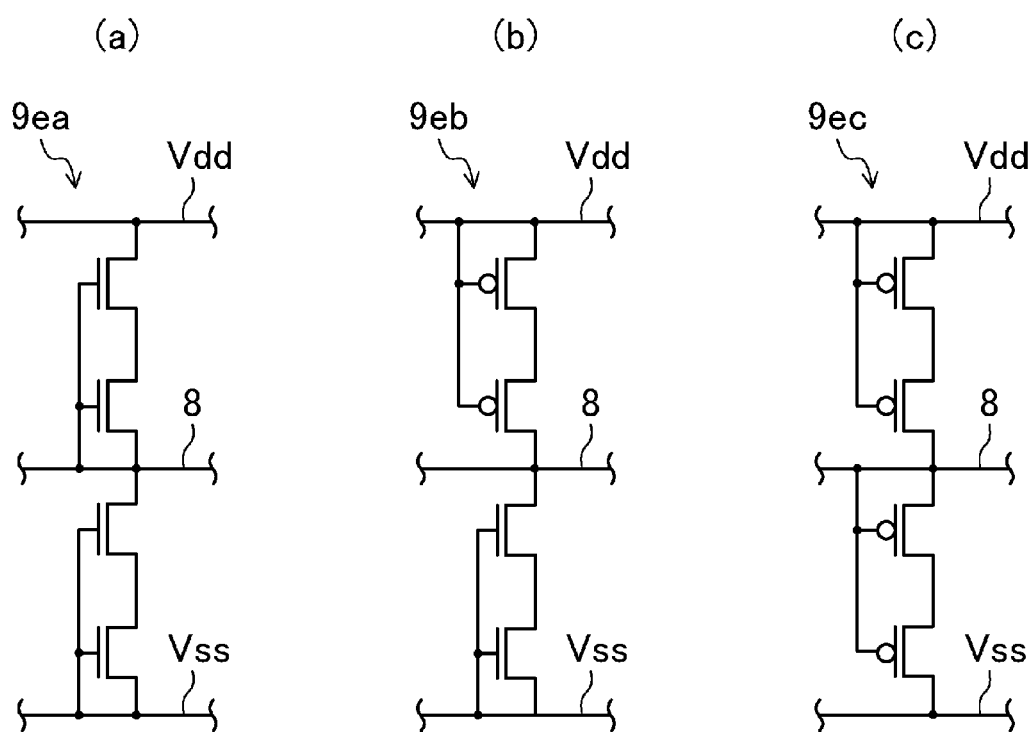
FIGS. 13(a)-13(c) are equivalent circuit diagrams of protection circuits constituting the peripheral circuit section of the active matrix substrate of the first embodiment.

FIGS. 1-14 illustrate an active matrix substrate and a display panel including the active matrix substrate according to a first embodiment of the present invention. FIG. 1 is a perspective view of a liquid crystal display panel 50 of this embodiment. FIG. 2 is a cross-sectional view of the liquid crystal display panel 50 taken along the line II-II in FIG. 1. FIG. 3 is a plan view of an active matrix substrate 20a constituting the liquid crystal display panel 50. FIGS. 4-10 are enlarged plan views of regions Ra-Rg in FIG. 3. FIG. 11 is a plan view schematically illustrating features of the active matrix substrate 20a. FIG. 12 is an equivalent circuit diagram of a demultiplexer circuit section 3 and a peripheral circuit section 4 constituting the active matrix substrate 20a. FIGS. 13(a)-13(c) are equivalent circuit diagrams of protection circuits 9e (9ea-9ec) constituting the peripheral circuit section 4.

As illustrated in FIGS. 1 and 2, the liquid crystal display panel 50 includes: an active matrix substrate 20a and a counter substrate 30 that are opposed to each other; a liquid crystal layer 40 serving as a display medium layer sandwiched between the active matrix substrate 20a and the counter substrate 30; and a sealing material 45 bonding the active matrix substrate 20a and the counter substrate 30 together and having a frame shape for enclosing the liquid crystal layer 40 between the active matrix substrate 20a and the counter substrate 30.

As illustrated in FIG. 1, in the active matrix substrate 20a, the counter substrate 30, and the liquid crystal display panel 50 including the active matrix substrate 20a and the counter substrate 30, a display region D where an image is to be displayed is defined as a rectangular shape inside the sealing material 45 (see FIGS. 2 and 3) and a frame region F is defined as a frame shape around the display region D. As illustrated in FIGS. 1 and 3, in the frame region F of the active matrix substrate 20a, a terminal region T is defined at an end of the substrate such that the terminal region T extends along the bottom, in the drawings, of the display region D and projects from the counter substrate 30. As illustrated in FIGS. 1 and 3, a mount region M on which the driver IC is to be mounted is defined in a center portion of the terminal region T of the active matrix substrate 20a and extends along the bottom, in the drawings, of the display region D.

As illustrated in FIGS. 2 and 3, the active matrix substrate 20a includes: a transparent substrate 10 such as a glass substrate; a plurality of gate signal lines 14c extending in the lateral direction in FIG. 3 in parallel with one another in the display region D and located above the transparent substrate 10 with an underlying film 11 and a gate insulating film 13 interposed therebetween; an interlayer insulating film 15 of an inorganic insulating film covering the gate signal lines 14c; a plurality of source signal lines 16a extending in parallel with one another in the direction (i.e., the vertical direction in FIG. 3) perpendicular to the gate signal lines 14c in the display region D and located on the interlayer insulating film 15; a plurality of thin film transistors (TFTs, not shown) disposed at each intersection between the gate signal lines 14c and the source signal lines 16a, i.e., in each subpixel, which is a minimum unit of an image; a protective insulating film 17 of an organic insulating film covering the TFTs; a plurality of pixel electrodes 18a arranged in matrix on the protective insulating film 17 in the display region D and individually connected to the TFTs; and an alignment film (not shown) covering the pixel electrodes 18a.

Each of the TFTs provided in the subpixels includes, for example, an island-shaped semiconductor layer on the underlying film 11, the gate insulating film 13 covering the semiconductor layer, a gate electrode located on the gate insulating film 13 and overlapping part of the semiconductor layer, the interlayer insulating film 15 covering the gate electrode, and source and drain electrodes that are located on the interlayer insulating film 15 and separated from each other. The TFTs have substantially the same configuration as a TFT 5 of a first unit circuit 3u, which will be described later. The gate electrodes are part of, or laterally extending projections of, the gate signal lines 14c in the subpixels. The source electrodes are part of, or laterally extending projections of, the source signal lines 16a in the subpixels. The drain electrodes are connected to the pixel electrodes 18a through contact holes (not shown) formed in the protective insulating film 17.

As illustrated in FIG. 3, the ends of each of the gate signal lines 14c are connected to gate control circuits 1 in the frame region F.

As illustrated in FIG. 3, the gate control circuits 1 are monolithically formed along the left side and the right side, in the drawing, of the display region D. As illustrated in FIG. 3, accessory wiring circuits 2 including a level shift circuit, a buffer circuit, a protection circuit for a general signal are monolithically provided near the gate control circuits 1. This configuration for driving from both ends of the gate signal lines 14c can reduce crosstalk (shadowing) that might occur with an increase in resolution of a pixel array.

As illustrated in FIG. 3, the source signal lines 16a are connected to the demultiplexer circuit section 3 in the frame region F.

Figure 4:
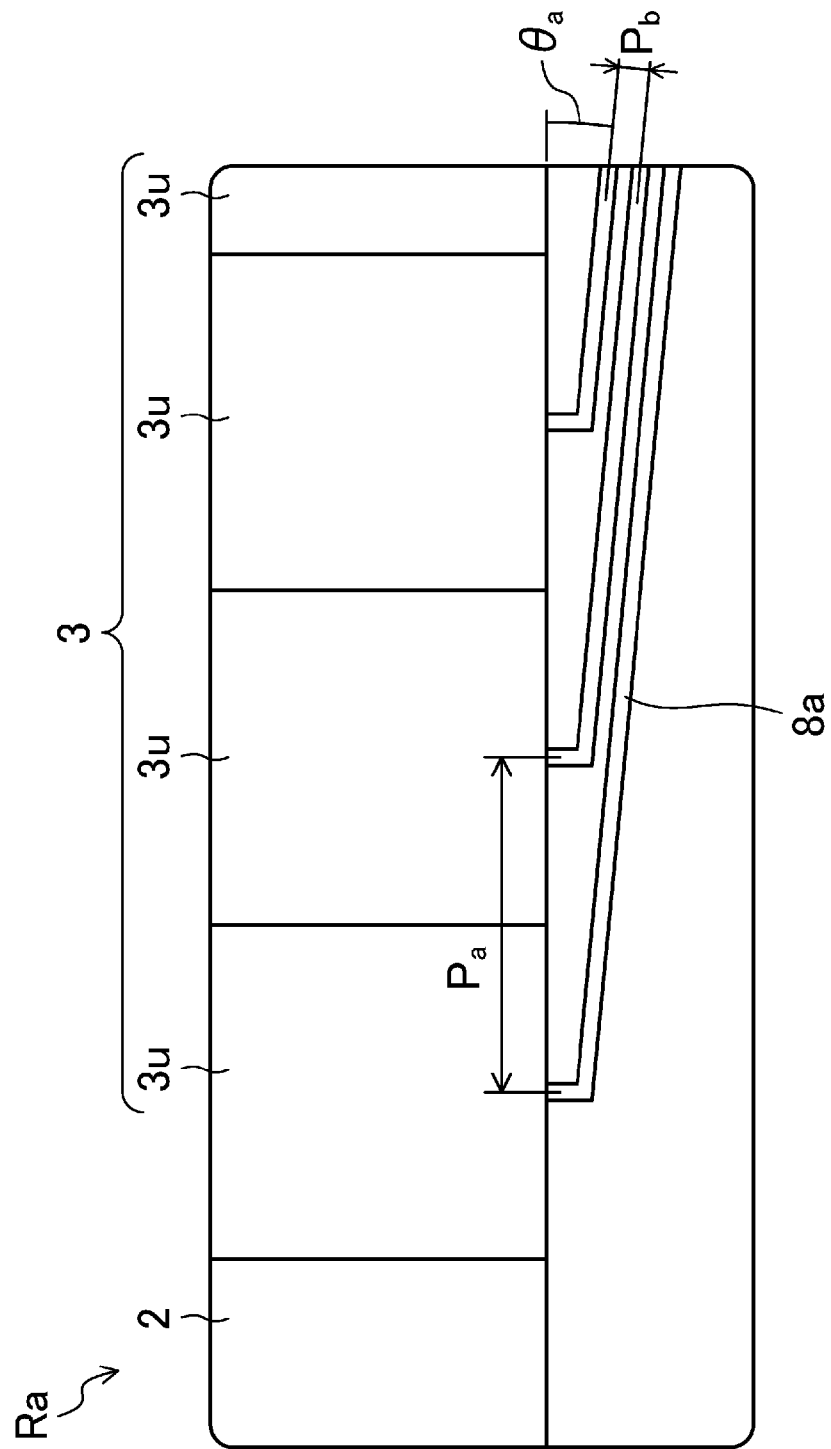
FIG. 4 is an enlarged plan view of a region Ra in FIG. 3.
Figure 8:
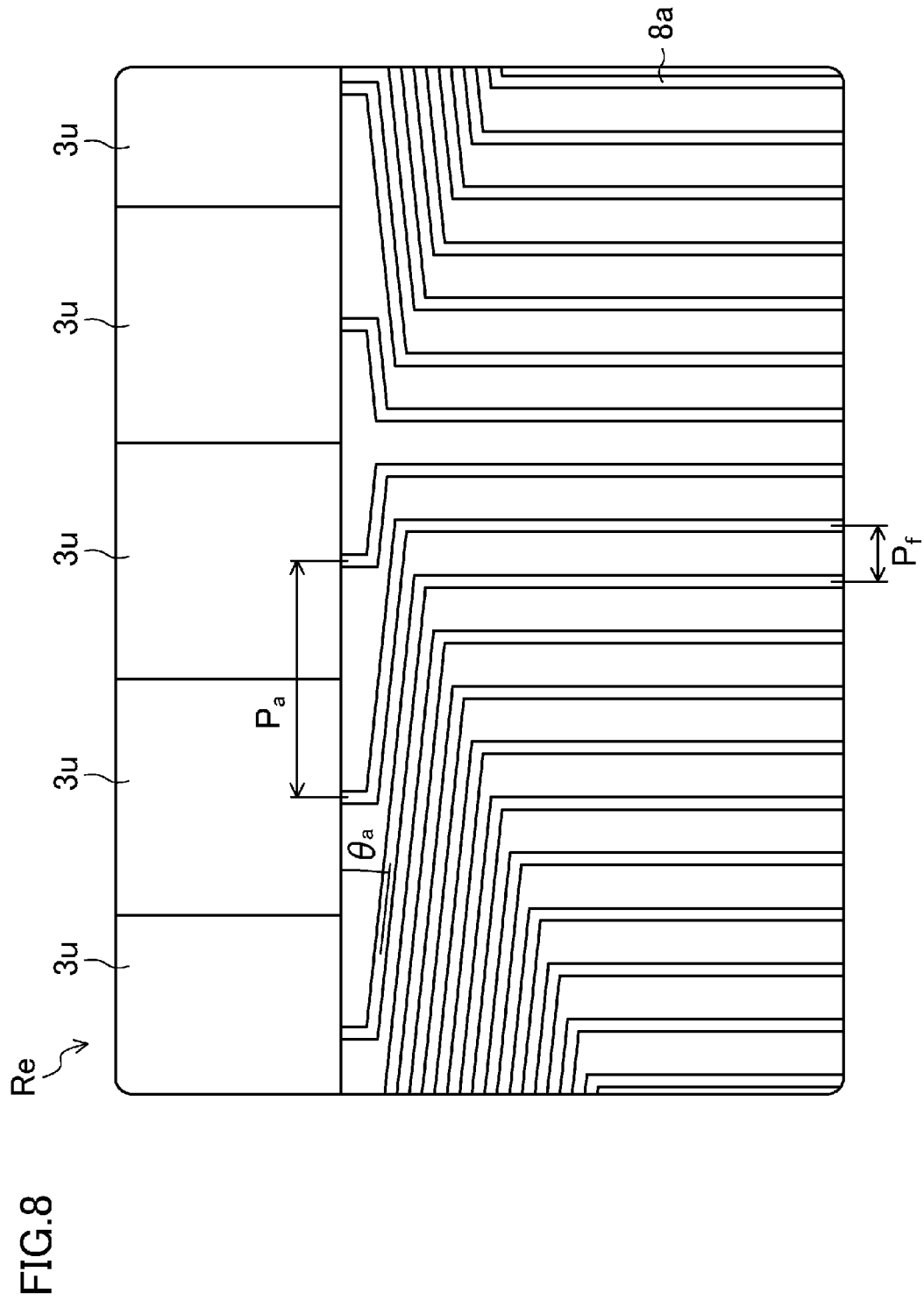
FIG. 8 is an enlarged plan view of a region Re in FIG. 3.

As illustrated in FIGS. 3 and 11, the demultiplexer circuit section 3 is located in the frame region F between the display region D and the mount region M and between the display region D and a peripheral circuit section 4, which will be described later. As illustrated in FIGS. 4, 8, and 11, the demultiplexer circuit section 3 includes a plurality of first unit circuits 3u arranged at an identical pitch $P_a$ along one side (i.e., the bottom side in FIG. 11) of the display region D. In addition, as illustrated in FIG. 3, the accessory wiring circuits 2 including the level shift circuit, the buffer circuit, the protection circuit for a general signal, the control signal line for a demultiplexer circuit, and a protection circuit for a control signal of the demultiplexer circuit are monolithically provided near the demultiplexer circuit section 3. In this embodiment, as illustrated in FIG. 4, the pitch refers a distance between the center lines of adjacent units. Here, the pitch is basically the distance between the center lines of adjacent units, but may be a distance between predetermined locations on adjacent units (e.g., one end of each of the adjacent units).

As illustrated in FIG. 12, the first unit circuits 3u are monolithically and individually provided for adjacent three source signal lines 16a, i.e., a source signal line 16aR for displaying red, a source signal line 16aG for displaying green, and a source signal line 16aB for displaying blue, and are connected to the three source signal lines 16a (16aR, 16aG, and 16aB). As illustrated in FIG. 12, the first unit circuits 3u include three TFTs 5 respectively connected to the source signal line 16aR for displaying red, the source signal line 16aG for displaying green, and the source signal line 16aB for displaying blue. In response to a control signal for the demultiplexer circuit, the first unit circuits 3u distribute, to the individual RGB color elements, source signals for display that have been input through video signal lines 8 including first video signal lines 8a and second video signal lines 8b, which will be described later, and through the peripheral circuit section 4.

As illustrated in FIG. 2, each of the TFTs 5 includes: an island-shaped semiconductor layer 12a on the underlying film 11; the gate insulating film 13 covering the semiconductor layer 12a; a gate electrode 14a located on the gate insulating film 13 and overlying part of the semiconductor layer 12a; an interlayer insulating film 15 covering the gate electrode 14a; and a source electrode (16a) and a drain electrode 16b that are located on the interlayer insulating film 15 and separated from each other.

The semiconductor layer 12a includes a channel region (not shown) overlying the gate electrode 14a and source and drain regions (not shown) that are separated from each other with the channel region sandwiched therebetween. A lightly doped drain (LDD) region may be provided between the channel region and each of the source region or the drain region in the semiconductor layer 12a.

As illustrated in FIG. 2, the source electrode (16a) of the TFT 5 is connected to the source region of the semiconductor layer 12a through a contact hole 15a formed in the multilayer film composed of the gate insulating film 13 and the interlayer insulating film 15, and serves as an end of the source signal line 16a.

As illustrated in FIG. 2, the drain electrode 16b of the TFT 5 is connected to the drain region of the semiconductor layer 12a through a contact hole 15b formed in the multilayer film composed of the gate insulating film 13 and the interlayer insulating film 15, and connected to an interconnect layer 14b constituting the video signal lines 8 through a contact hole 15c formed in the interlayer insulating film 15. The source electrode (16a) and the drain electrode 16b of the TFT 5 are made of a metal material having a low resistance, such as aluminium or chromium. The interconnect layer 14b is made of a metal material having a high corrosion resistance, such as tungsten or tantalum.

As illustrated in FIGS. 3 and 11, the peripheral circuit section 4 is located in the frame region F between the demultiplexer circuit section 3 and the mount region M. As illustrated in FIGS. 5, 7, 9, 11, and 12, the peripheral circuit section 4 includes a plurality of second unit circuits 4u (4ua and 4ub) aligned along one side (i.e., the bottom side in FIG. 11) of the display region D as a plurality of unit circuit sections. As illustrated in FIG. 11, the accessory wiring circuits 2 including the level shift circuit, the buffer circuit, the protection circuit for a general signal, the control signal line for the demultiplexer circuit, and the protection circuit for a control signal of the demultiplexer circuit may be monolithically provided near the peripheral circuit section 4.

As illustrated in FIGS. 5, 7, 9, and 11, the second unit circuits 4u include: a plurality of second unit circuits 4ua arranged at an outer side at a relatively large pitch $P_c$; and a plurality of second unit circuits 4ub arranged at an inner side at a relatively small pitch $P_f$ and are monolithically provided.

As illustrated in FIG. 12, the second unit circuits 4u include: an inspection circuit 6e for inputting an inspection signal to the first unit circuits 3u; and a protection circuit 9e for protecting, for example, the first unit circuits 3u, the inspection circuit 6e, and TFTs provided in the individual subpixels.

As illustrated in FIG. 12, the inspection circuit 6e includes one TFT having substantially the same configuration as that of the TFTs 5 of the first unit circuits 3u, and in response to a control signal for inspection, inputs an inspection signal to an associated one of the first unit circuits 3u.

The protection circuit 9e is, for example, a protection circuit 9ea in which four n-channel TFTs are provided between a high-potential power supply line Vdd for supplying a relatively high voltage and a low-potential power supply line Vss for supplying a relatively low voltage as illustrated in FIG. 13(a), a protection circuit 9eb in which two n-channel TFTs and two p-channel TFT are provided between a high-potential power supply line Vdd and a low-potential power supply line Vss as illustrated in FIG. 13(b), or a protection circuit 9ec in which four p-channel TFTs are provided between a high-potential power supply line Vdd and a low-potential power supply line Vss as illustrated in FIG. 13(c).

As illustrated in FIGS. 3-5, 7-9, and 11, the second unit circuits 4u are individually connected to the first unit circuits 3u through a plurality of first video signal lines 8a serving as a plurality of first lines.

As illustrated in FIGS. 3 and 11, the first video signal lines 8a are arranged such that the outline of the first video signal lines 8a narrows from the first unit circuits 3u toward the second unit circuits 4u (4ua and 4ub). Specifically, first, as illustrated in FIG. 4, the first video signal lines 8a extend in parallel with one another at an arrangement pitch Pb from the first unit circuits 3u arranged at an arrangement pitch $P_a$ in a direction intersecting with one side (i.e., the bottom side in FIG. 3) of the display region D at an angle $\theta_a$. Thereafter, as illustrated in FIGS. 5 and 7-9, the first video signal lines 8a bend in a direction perpendicular to the side (i.e., the bottom side in FIG. 3) of the display region D, and then extend in parallel with one another at arrangement pitches $P_c$ and $P_f$. In this manner, the first video signal lines 8a reach the second unit circuits 4ua and the second unit circuits 4ub.

As illustrated in FIGS. 3, 5-7, and 9-11, the second unit circuits 4u (4ua and 4ub) are individually connected to a plurality of terminals 7 in the mount region M, through a plurality of second video signal lines 8b serving as a plurality of second lines.

Figure 5:
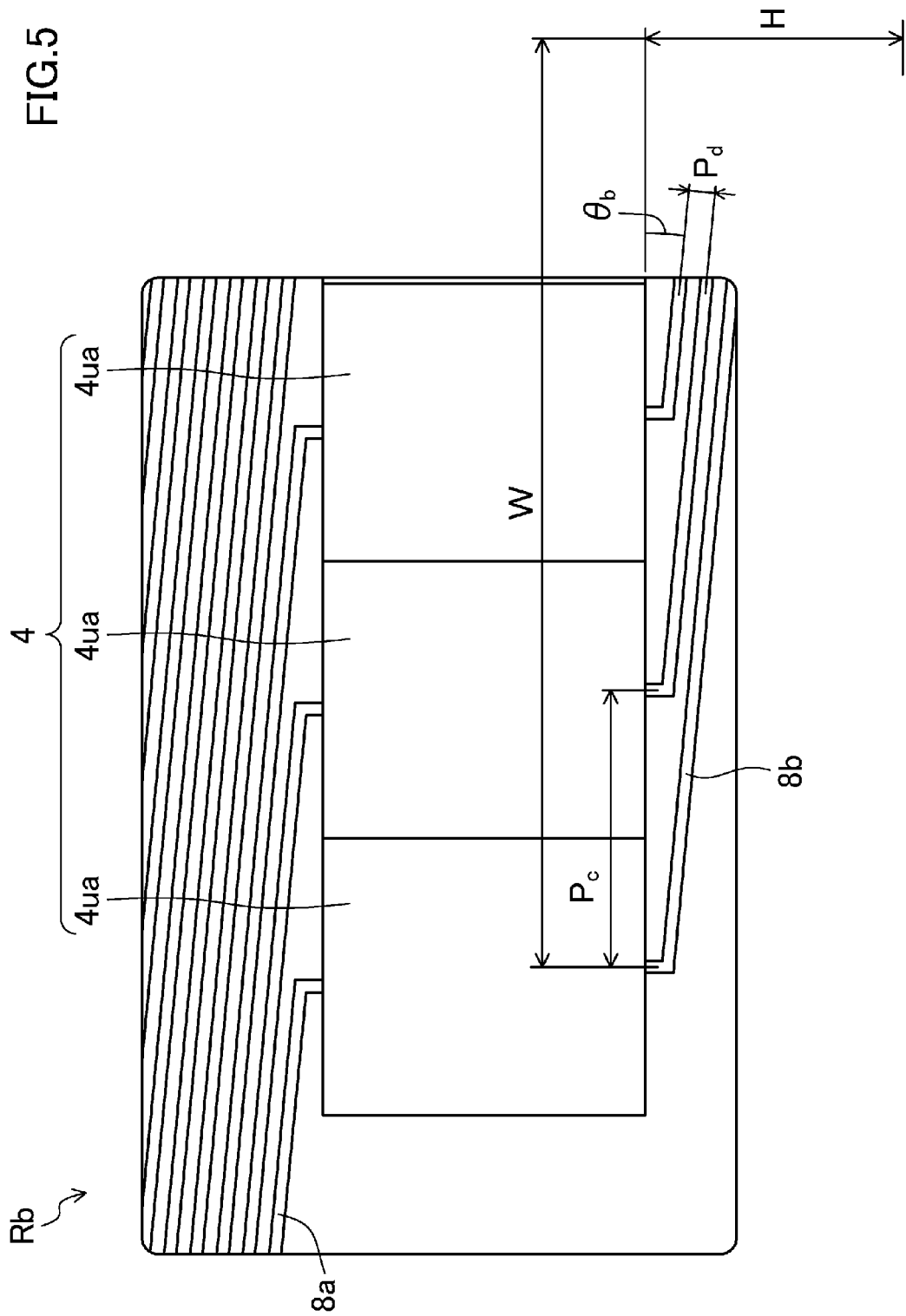
FIG. 5 is an enlarged plan view of a region Rb in FIG. 3.
Figure 6:
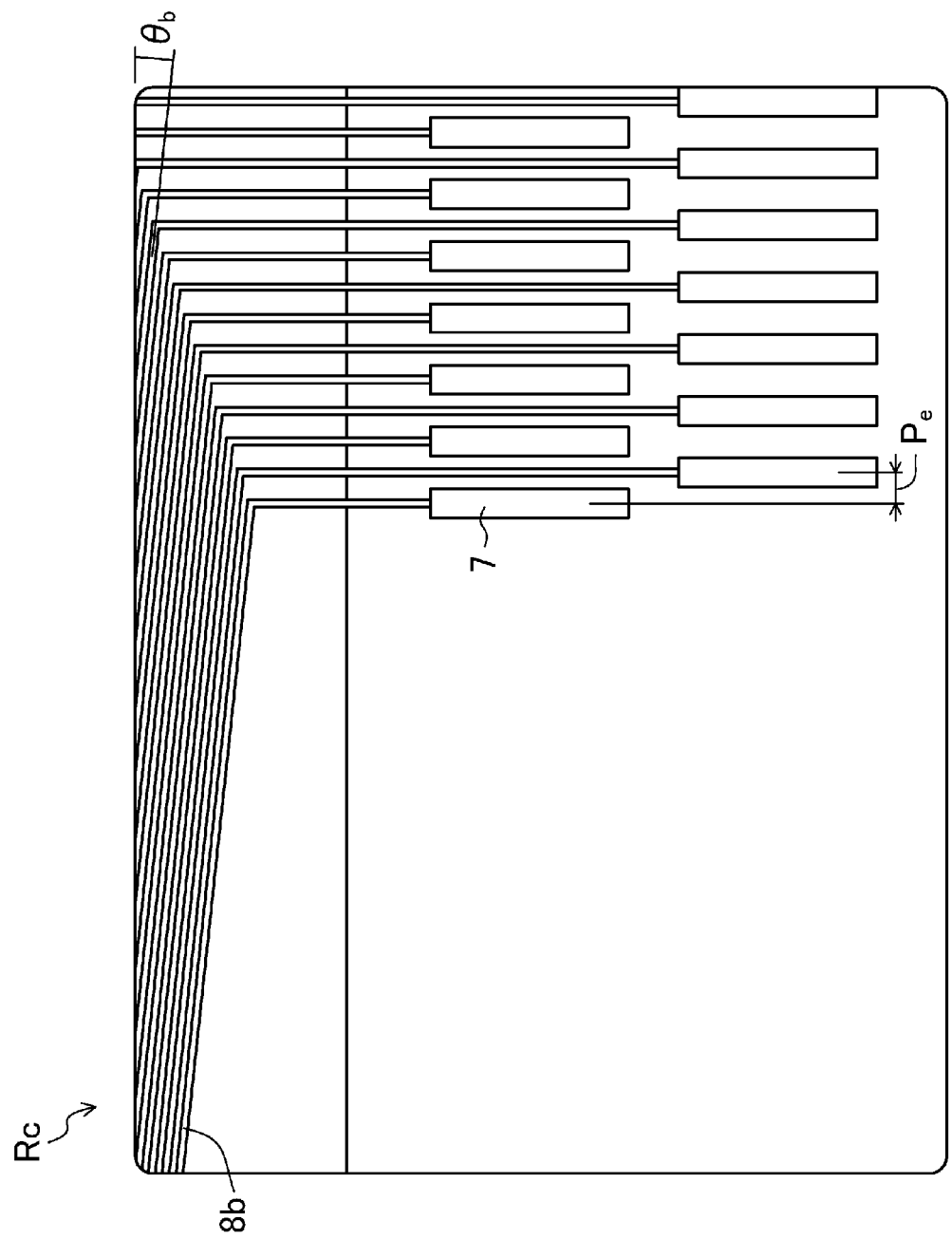
FIG. 6 is an enlarged plan view of a region Rc in FIG. 3.
Figure 7:
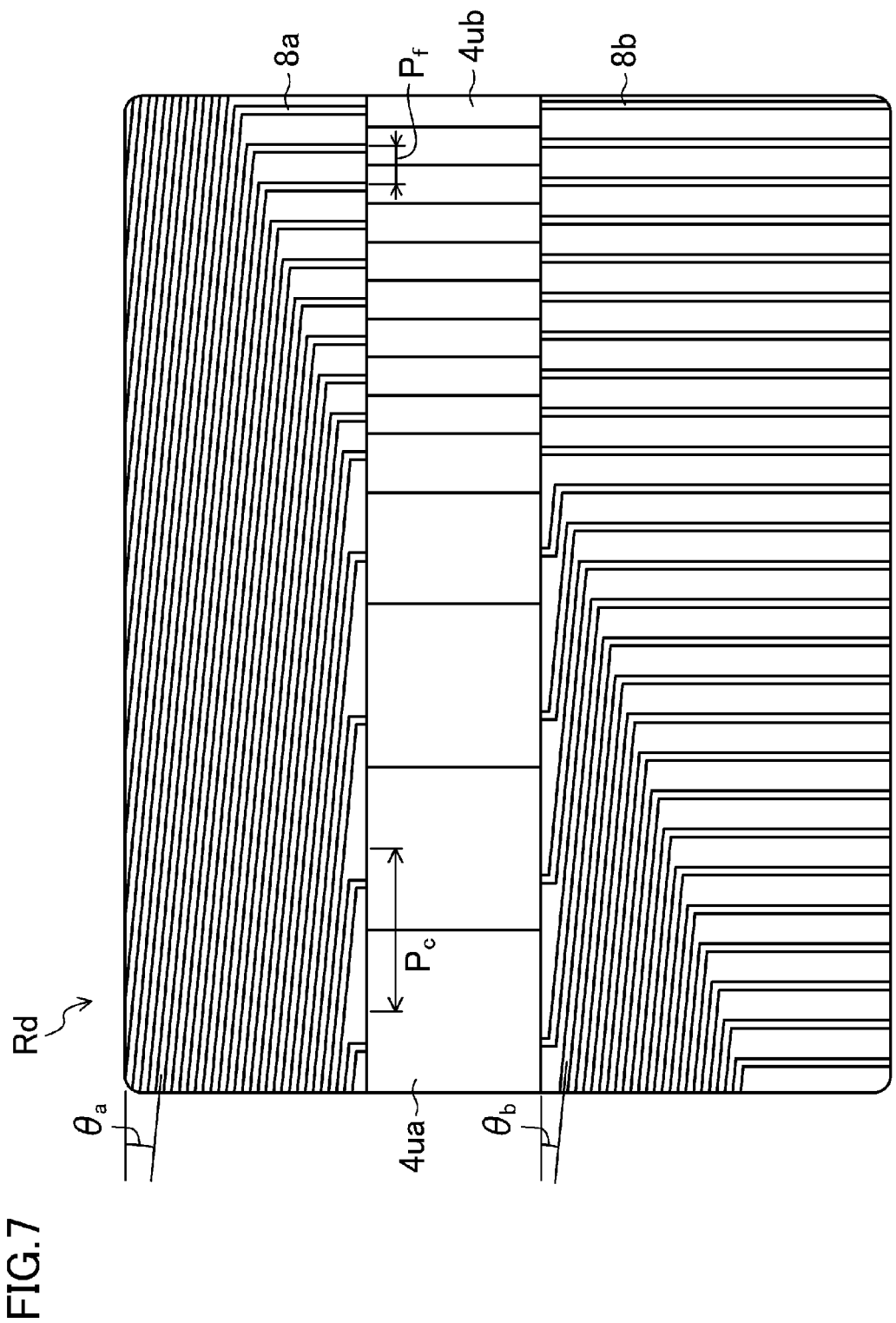
FIG. 7 is an enlarged plan view of a region Rd in FIG. 3.
Figure 9:
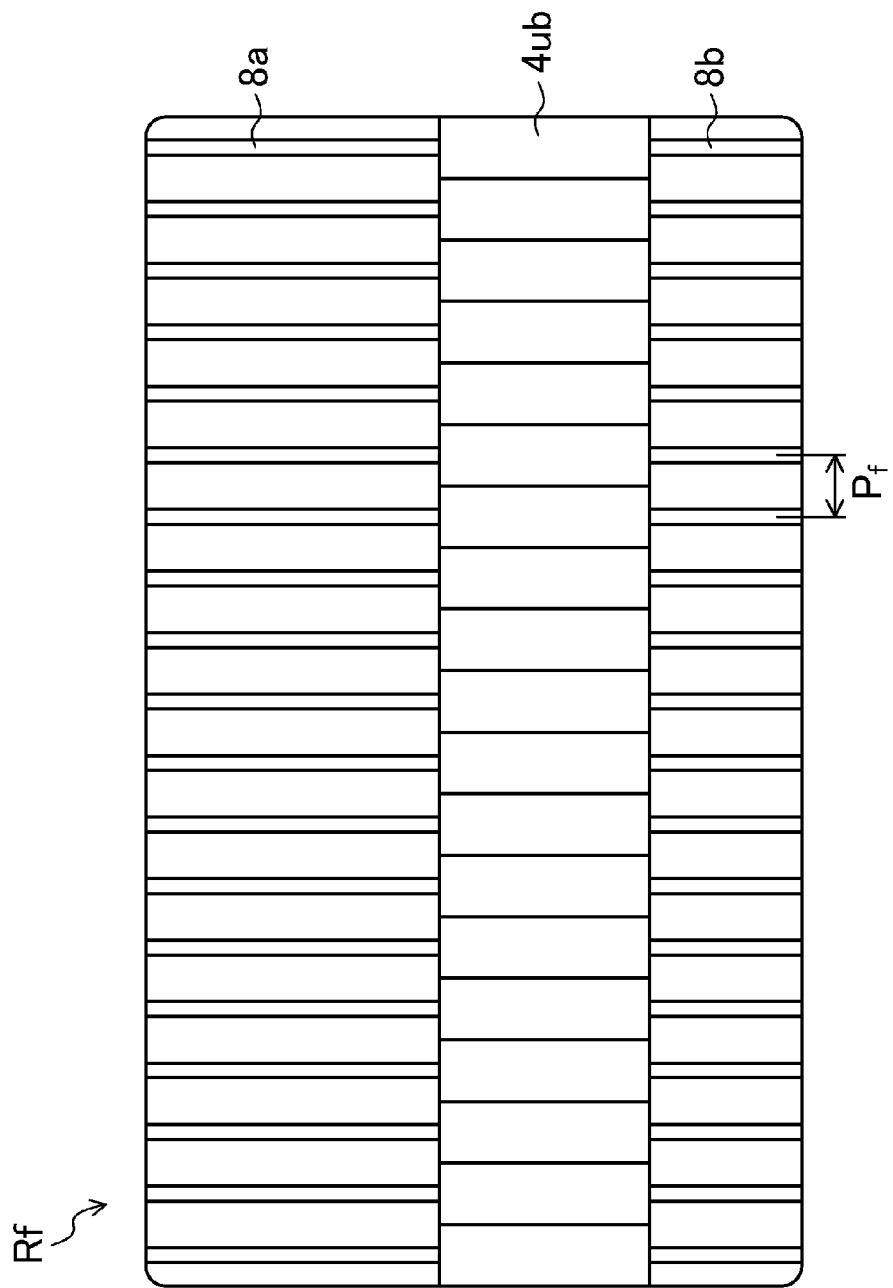
FIG. 9 is an enlarged plan view of a region Rf in FIG. 3.
Figure 10:
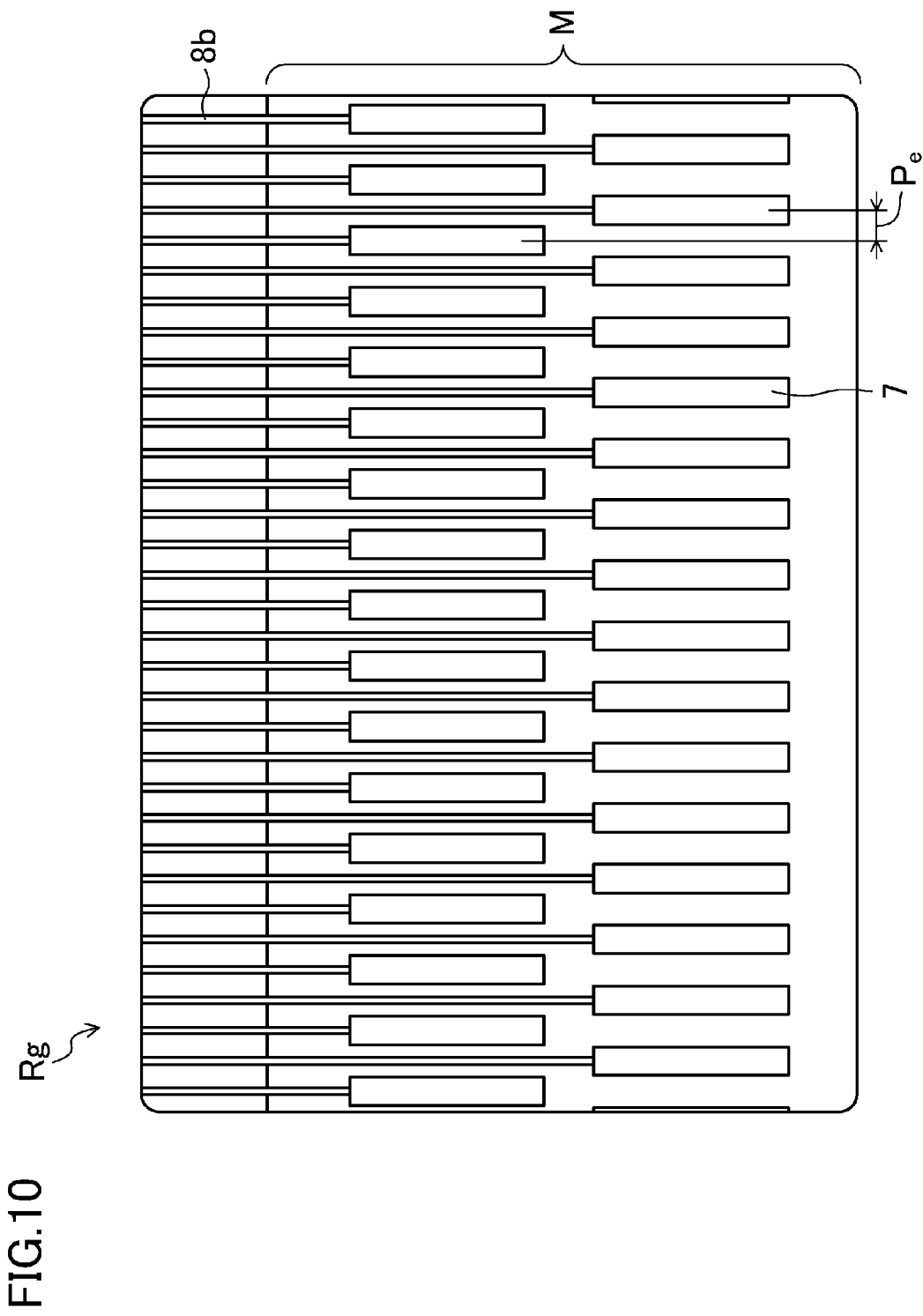
FIG. 10 is an enlarged plan view of a region Rg in FIG. 3.

As illustrated in FIGS. 3 and 11, the second video signal lines 8b are arranged such that the outline of the second video signal lines 8b narrows from the second unit circuits 4u (4ua and 4ub) toward the mount region M. Specifically, first, as illustrated in FIG. 5, outer ones of the second video signal lines 8b extend in parallel with one another at an arrangement pitch $P_d$ from the second unit circuits 4ua arranged at an arrangement pitch $P_c$ in a direction intersecting with the side (i.e., the bottom side in FIG. 3) of the display region D at an angle $\theta_b$. Thereafter, as illustrated in FIG. 6, the outer second video signal lines 8b bend in a direction perpendicular to the side (i.e., the bottom side in FIG. 3) of the display region D, and then extend in parallel with one another in an arrangement pitch $P_e$. In this manner, the second video signal lines 8b reaches the terminals 7 arranged at the arrangement pitch $P_e$. As illustrated in FIGS. 7 and 9, inner ones of the second video signal lines 8b extend in parallel with one another at the arrangement pitch $P_f$ from the second unit circuits 4ub arranged at the arrangement pitch $P_f$ in a direction perpendicular to the side (i.e., the bottom side in FIG. 3) of the display region D. In this manner, the inner second video signal lines 8b reach the terminals 7 arranged at the arrangement pitch $P_e$. In the mount region M, as illustrated in FIG. 2, a metal conductive layer 16c and a transparent conductive layer 18b are stacked at an end of the interconnect layer 14b constituting the second video signal lines 8b over a contact hole 15d formed in the interlayer insulating film 15. In this manner, the terminals 7 are formed.

As illustrated in FIG. 2, the video signal lines 8 are covered with the multilayer film composed of the interlayer insulating film 15 and the protective insulating film 17 to a region projecting from the counter substrate 30. Thus, corrosion of the video signal lines 8 can be reduced. In addition, even when an end surface of a substrate to be the counter substrate 30 comes into contact with the video signal lines 8 in dividing the substrate, damage of the video signal lines 8 can be reduced. To reduce damage of the video signal lines 8, the protective insulating film (17) may cover the entire surface of the active matrix substrate 20a. However, to prevent the protective insulating film (17) from peeling off and becoming a foreign substance in a subsequent step, an unnecessary portion of the protective insulating film (17) corresponding to the terminal region T is preferably removed beforehand. The configuration in which the protective insulating film 17 is made of the organic insulating film is effective in the case of forming a pixel electrode including a reflecting electrode with an uneven surface and the case of designing pixels having a high aperture ratio with a pixel-on-passivation structure, for example.

The parallel arrangement of the video signal lines 8 is not necessarily composed of simply linear parallel lines. For example, the video signal lines 8 may extend in parallel with one another toward the mount region M while slightly winding in order to uniformize the line lengths of the video signal lines 8. In addition, each of the video signal lines 8 may be deformed within an arbitrary short distance in order to adjust the line position. That is, the term "parallel lines" herein refers to a concept different from that of the term "extend in parallel with one another," and the term "extend in parallel with one another" herein has a broader meaning than the term "parallel lines."

As illustrated in FIG. 5, in order to reduce a length H of the second video signal lines 8b along a direction perpendicular to the side (i.e., the bottom side in FIG. 3) of the display region D extending in a direction intersecting with the side (i.e., the bottom side in FIG. 3) of the display region D at an angle $\theta_b$, the angle $\theta_b$ needs to be reduced based on the relationship:

$$\tan \theta_b = H/W.$$

To reduce the angle $\theta_b$, based on the relationship:

$$\sin \theta_b = P_d/P_c,$$

the arrangement pitch $P_c$ is increased because the arrangement pitch $P_d$ is restricted by manufacturing apparatus and manufacturing processes.

On the other hand, to obtain a sufficient space for other circuits and lines, e.g., the level shift circuit, the buffer circuit, the protection circuit for a general signal, the control signal line for the demultiplexer circuit, and the protection circuit for a control signal, near the both ends of the peripheral circuit section 4, the pitch of the unit circuits 4u constituting the peripheral circuit section 4 is reduced. However, if the arrangement pitch of the unit circuits 4u is uniformly reduced, the arrangement pitch $P_c$ decreases, resulting in an increase in length H.

To prevent such a situation, in the present invention, the arrangement pitch of the outer second unit circuits 4u is made larger than that of the inner second unit circuits 4u. Specifically, as illustrated in FIG. 11, the arrangement pitch $P_c$ of the outer second unit circuits 4ua is larger than the arrangement pitch $P_f$ of the inner second unit circuits 4ub. Thus, a sufficient space for providing other circuits and lines is obtained near the both ends of the peripheral circuit section 4, and the length H of the second video signal lines 8b along the direction perpendicular to the side (i.e., the bottom side in FIG. 3) of the display region D.

The counter substrate 30 includes, for example, a transparent substrate (not shown) such as a glass substrate, a black matrix (not shown) arranged in a lattice on the transparent substrate, a plurality of colored layers (not shown) such as a red layer, a green layer, and a blue layer provided at individual units of the lattice of the black matrix, a common electrode (not shown) covering the black matrix and the colored layers, a plurality of columnar photo spacers (not shown) located on the common electrode, and an alignment film (not shown) covering the common electrode and the photo spacers.

The liquid crystal layer 40 is made of, for example, a nematic liquid crystal material having electrooptic properties.

In each of the subpixels of the liquid crystal display panel 50 with the above-described configuration, when a gate signal from the gate control circuit 1 is sent to the gate electrode through the gate signal lines 14c so that the TFT turns on, a source signal from the driver IC mounted on the mount region M is sent to the source electrode through the video signal lines 8, the demultiplexer circuit section 3, and the source signal lines 16a, and a predetermined amount of charge is written in the pixel electrodes 18a through the semiconductor layer and the drain electrode. At this time, in the liquid crystal display panel 50, a potential difference occurs between each of the pixel electrodes 18a of the active matrix substrate 20a and the common electrode of the counter substrate 30, and a predetermined voltage is applied to the liquid crystal layer 40. In each of the subpixels of the liquid crystal display panel 50, the alignment state of the liquid crystal layer 40 is changed depending on the voltage applied to the liquid crystal layer 40 such that the light transmittance of the liquid crystal layer 40 is adjusted and an image is displayed on the display region D.

A method for fabricating a liquid crystal display panel 50 according to this embodiment will now be described. The method for fabricating a liquid crystal display panel 50 of this embodiment includes an active matrix substrate fabrication process, a counter substrate fabrication process, and a liquid crystal injection process.

<Active Matrix Substrate Fabrication Process>

First, a silicon nitride film, a silicon oxide film, or a multilayer film of the silicon nitride film and the silicon oxide film, for example, is deposited by chemical vapor deposition (CVD) over a transparent substrate 10 such as a glass substrate to a thickness of about 50 nm, thereby forming an underlying film 11.

Next, an intrinsic amorphous silicon film is deposited by, for example, CVD to a thickness of about 50 nm over the entire substrate on which the underlying film 11 is formed, and then polycrystallized by annealing such as irradiation with laser light, thereby forming a polysilicon film. The polysilicon film is subjected to photolithography, etching, and removal of a resist, thereby forming a semiconductor layer 12a and other components.

Thereafter, a silicon nitride film, a silicon oxide film, or a multilayer film of the silicon nitride film and the silicon oxide film, for example, is deposited by, for example, CVD to a thickness of about 100 nm over the entire substrate on which the semiconductor layer 12a and other components are formed, thereby forming a gate insulating film 13.

Subsequently, a metal film such as a tungsten film is deposited by, for example, sputtering to a thickness of about 300 nm over the entire substrate on which the gate insulating film 13 is formed, and is subjected to photolithography, etching, and removal of a resist, thereby forming, for example, gate signal lines 14c, a gate electrode 14a, and an interconnect layer 14b.

Then, the semiconductor layer 12a and other components on the substrate on which the gate signal lines 14c, for example, is formed are doped with an impurity such as phosphorus and boron with the gate electrode 14a used as a mask, thereby forming a channel region, a source region, and a drain region in, for example, the semiconductor layer 12a.

Thereafter, an inorganic insulating film such as a silicon nitride film, a silicon oxide film, or a multilayer film of the silicon nitride film and the silicon oxide film is deposited by, for example, CVD to a thickness of about 700 nm over the entire substrate in which the channel region, the source region, and the drain region are formed in the semiconductor layer 12a. Then, the inorganic insulating film and the gate insulating film 13 underlying the inorganic insulating film are subjected to photolithography, etching, and removal of a resist, thereby forming an interlayer insulating film 15 including contact holes 15a, 15b, 15c, and 15d.

Then, a metal film such as an aluminium film is deposited by, for example, sputtering to a thickness of about 350 nm over the entire substrate on which the interlayer insulating film 15 is formed, and is subjected to photolithography, etching, and removal of a resist, thereby forming, for example, source signal lines 16a, a drain electrode 16b, and a metal conductive layer 16c. In this manner, TFTs 5 and first unit circuits 3u of a demultiplexer circuit section 3 including the TFTs 5 are formed. In this process, TFTs provided in individual subpixels, a gate control circuit 1, and inspection circuits 6e and protection circuits 9e constituting second unit circuits 4u of a peripheral circuit section 4 are also formed.

Further, a photosensitive acrylic resin film is applied by, for example, spin coating or slit coating to a thickness of about 2 μm over the entire substrate on which the source signal lines 16a, for example, is formed, and then is prebaked, exposed to light, developed, and postbaked, thereby forming a protective insulating film 17 having a contact hole.

Then, a transparent conductive film such as an indium tin oxide (ITO) film is deposited by, for example, sputtering to a thickness of about 100 nm over the entire substrate on which the protective insulating film 17 is formed, and is subjected to photolithography, etching, and removal of a resist, thereby forming pixel electrodes 18a and a transparent conductive layer 18b.

Lastly, a polyimide resin film is applied by, for example, spin coating, slit coating, or printing onto the entire substrate on which the pixel electrodes 18a, for example, are formed, and the polyimide resin film is subjected to baking and rubbing, thereby forming an alignment film.

In the foregoing manner, an active matrix substrate 20a of this embodiment can be fabricated.

<Counter Substrate Fabrication Process>

First, a black-colored photosensitive resin is applied by, for example, spin coating or slit coating onto the entire surface of a transparent substrate such as a glass substrate, and then is exposed to light and developed, thereby forming a black matrix to a thickness of about 1 μm.

Then, a red-, green-, or blue-colored photosensitive resin is applied by, for example, spin coating or slit coating onto the entire substrate on which the black matrix is formed, and then is exposed to light and developed, thereby forming a colored layer of a selected color (e.g., a red layer) with a thickness of about 1-3 μm. Similar processes are repeatedly performed for the other two colors, thereby forming colored layers of the other two colors (e.g., a green layer and a blue layer) each with a thickness of about 1-3 μm.

Subsequently, a transparent conductive film such as an ITO film is deposited by, for example, sputtering to a thickness of about 100 nm with a mask, over the entire substrate on which the colored layers are formed, thereby forming a common electrode.

Then, a photosensitive acrylic resin film is applied by, for example, spin coating or slit coating to a thickness of about 4 μm onto the entire substrate on which the common electrode is formed, and then is prebaked, exposed to light, developed, and postbaked, thereby forming photo spacers.

Lastly, a polyimide resin film is applied by, for example, spin coating, slit coating, or printing onto the entire substrate on which the photo spacers are formed, and then is subjected to baking and rubbing, thereby forming an alignment film.

In the foregoing manner, a counter substrate 30 of this embodiment can be fabricated.

<Liquid Crystal Injection Process>

First, a sealing material 45 of an ultraviolet (UV)/thermosetting resin is printed in a frame shape on the surface of the counter substrate 30 fabricated in the counter substrate fabrication process, for example, and then a liquid crystal material (40) is dropped inside the frame of the sealing material 45.

Subsequently, the counter substrate 30 on which the liquid crystal material (40) has been dropped and the active matrix substrate 20a fabricated in the active matrix substrate fabrication process are bonded together under a reduced pressure to form a bonded assembly. This bonded assembly is then exposed to the air under an atmospheric pressure, thereby pressurizing the front and back surfaces of the bonded assembly.

Furthermore, the sealing material 45 enclosed in the bonded assembly is irradiated with UV light, and then the bonded assembly is heated, thereby curing the sealing material 45.

Lastly, the bonded assembly enclosing the cured sealing material is cut by, for example, dicing, and unwanted portions thereof are removed.

In the foregoing manner, a liquid crystal display panel 50 of this embodiment can be fabricated.

Figure 14:
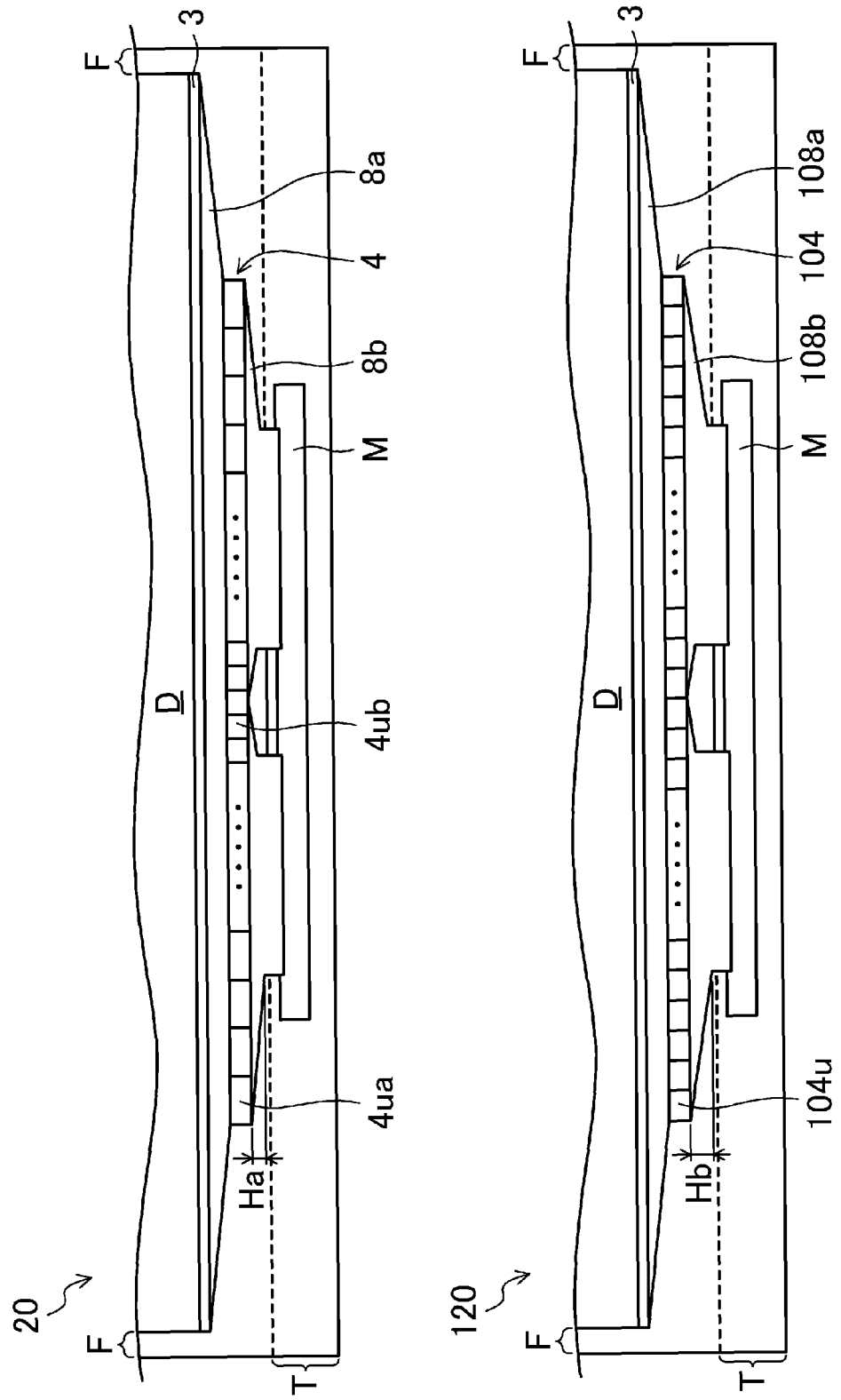
FIG. 14 illustrates advantages obtained by using the active matrix substrate of the first embodiment.

Next, the difference between the width of the frame region F along the terminal region D in an active matrix substrate 20 of a practical example of this embodiment and the width of a frame region F along a terminal region D in an active matrix substrate 120 of a comparative example will be described. FIG. 14 illustrates advantages obtained by using the active matrix substrate 20 of this embodiment. In FIG. 14, outlines of the entire first video signal lines 8a and 108a and the second video signal lines 8b and 108b are shown.

In the active matrix substrate 20 in FIG. 14, the second video signal lines 8b are divided into two portions, i.e., a left portion and a right portion, and the other part of the configuration of the active matrix substrate 20 is substantially the same as the above-described active matrix substrate 20a. As illustrated in FIG. 14, in the active matrix substrate 120, second unit circuits 104u constituting a peripheral circuit section 104 are arranged at a uniform arrangement pitch, and the other part of the configuration of the active matrix substrate 120 is substantially the same as the active matrix substrate 20.

Suppose the active matrix substrate 20 and the active matrix substrate 120 are deigned as indicated in Table 1. Specifically, the active matrix substrate 20 is designed such that the arrangement pitch of 132 outer ones of the second unit circuits 4ua constituting the peripheral circuit section 4 is 81 μm and the arrangement pitch of 456 inner ones of the second unit circuits 4ub is 39 μm and the active matrix substrate 120 is designed such that the arrangement pitch of 720 second unit circuit 104u constituting the peripheral circuit section 104 is 54.5 μm. Then, a frame dimension Ha of second video signal lines 8b is 1410 μm in the active matrix substrate 20 and a frame dimension Hb of second video signal lines 108b is 1770 μm in the active matrix substrate 120. Then, it is confirmed that the width of the frame region F along the final terminal region D is reduced to 360 μm (=6710 μm−6350 μm).

TABLE 1

|  |  | Practical Example | Comparative Example |
|---|---|---|---|
|  | Subpixel Size | 27 μm × 81 μm | 27 μm × 81 μm |
|  | Number of Subpixels | 720 × RGB × 1280 | 720 × RGB × 1280 |
|  | Screen Size (Diagonal) | 4.68 inches (118.9 mm) | 4.68 inches (118.9 mm) |
| Demultiplexer Circuit Section | Height of Unit Circuits | 300 μm | 300 μm |
|  | Pitch of Unit Circuits | 27 μm × 2160 | 27 μm × 2160 |
| Peripheral Circuit Section | Height of Unit Circuits | 1000 μm | 1000 μm |
|  | Pitch of Unit Circuits | 81 μm × 132 + 39 μm × 456 + 81 μm × 132 | 54.5 μm × 720 |
|  | Driver IC (Pitch of Output Terminals) | 28 μm | 28 μm |
|  | Design Rule of Video Signal Line | L/S = about 4 μm/4 μm | L/S = about 4 μm/4 μm |
| Frame Region Size (μm) | Display Region to Demultiplexer Circuit Section | 90 | 90 |
|  | Demultiplexer Circuit Section | 300 | 300 |
|  | First Video Signal Line | 1000 | 1000 |
|  | Peripheral Circuit Section | 1000 | 1000 |
|  | Second Video Signal Line | 1410 | 1770 |
|  | Mount Region | 1360 | 1360 |
|  | IC to Glass End | 1190 | 1190 |
|  | Total (Display Region to Glass End) | 6350 | 6710 |

As described above, in the active matrix substrate 20a (20) and the liquid crystal display panel 50 including the active matrix substrate 20a (20) of this embodiment, in the frame region F along the terminal region T near the substrate end in the frame region F defined around the rectangular display region D, the peripheral circuit section 4 is provided between the demultiplexer circuit section 3 near the display region D and the mount region M that is a part of the terminal region T. In the peripheral circuit section 4, the monolithically provided second unit circuits 4u are aligned along one side of the display region D. The arrangement pitch of outer ones of the second unit circuits 4u is larger than that of inner ones of the second unit circuits 4u. Thus, suppose the length of the peripheral circuit section 4 (104) along one side of the display region D is common and the number of second unit circuits 4u (104u) included in the peripheral circuit section 4 (104) is common, for example, then the narrowing of the outline of the entire second video signal lines 8b becomes gentle, i.e., the angle θ$_b$ formed by the outermost second video signal line 8b with the side of the display region D is reduced, as compared to a case where the arrangement pitches of the second unit circuits 104u are uniform at an average value. In this manner, the length H of the outline of the entire second video signal lines 8b in a direction perpendicular to the side of the display region D is reduced. As a result, the width of the frame region F along the terminal region T can be minimized in the active matrix substrate 20a with the three-side-free structure and the liquid crystal display panel 50 including the active matrix substrate 20a.

In the active matrix substrate 20a of this embodiment, a length of the peripheral circuit section 4 along one side of the display region D is smaller than that of the demultiplexer circuit section 3 along the side of the display region D. Thus, it is possible to obtain a sufficient space for disposing other circuits and lines, such as the level shift circuit, the buffer circuit, the protection circuit for a general signal, the control signal line for the demultiplexer circuit, and the protection circuit for the control signal, near the both ends of the peripheral circuit section 4.

The active matrix substrate 20a of this embodiment includes the peripheral circuit section 4 in which the inspection circuit 6e and the protection circuit 9e are disposed in this order from the demultiplexer circuit section 3 in each of the unit circuits 4u. Alternatively, each of the unit circuits 4u of the peripheral circuit section 4 may be designed such that the protection circuit (9e) and the inspection circuit (6e) may be disposed in this order from the demultiplexer circuit section 3.

Second Embodiment

Figure 15:
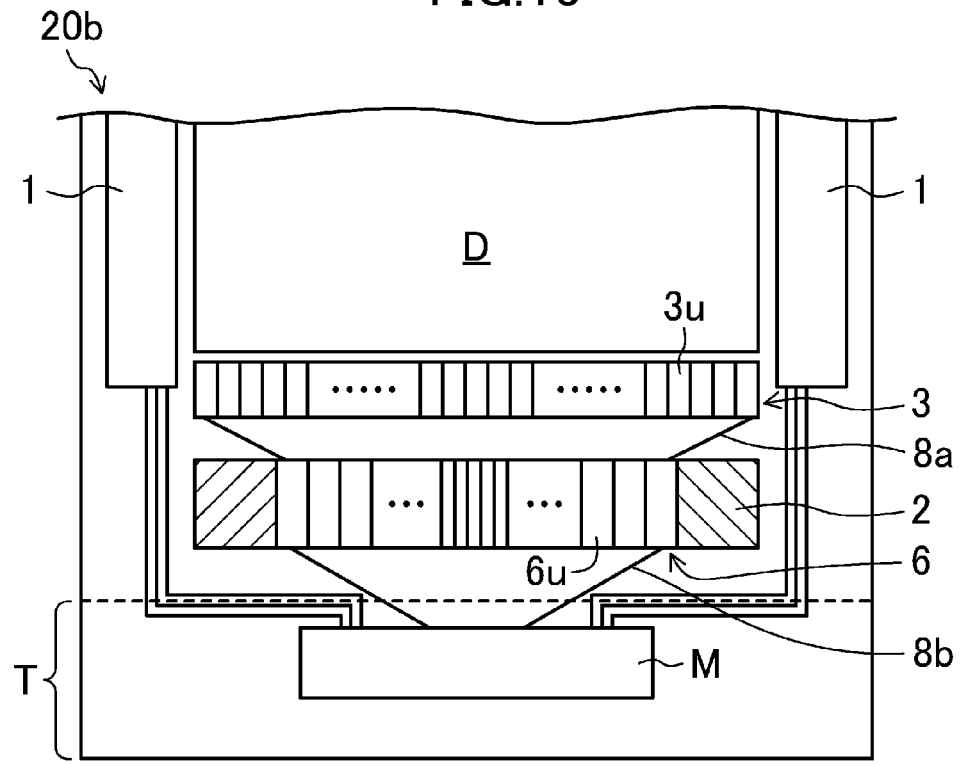
FIG. 15 is a plan view of an active matrix substrate according to a second embodiment.

FIG. 15 is a plan view of an active matrix substrate 20b according to a second embodiment. In the following embodiments, components already described with reference to FIGS. 1-14 are denoted by the same reference characters, and description thereof is not repeated.

The first embodiment is directed to the active matrix substrate 20a in which the peripheral circuit section 4 includes the inspection circuits 6e and the protection circuits 9e. On the other hand, in the second embodiment, an active matrix substrate 20b includes a peripheral circuit section 6 in which only inspection circuits are provided.

As illustrated in FIG. 15, in the active matrix substrate 20b, second unit circuits 6u constituting the peripheral circuit section 6 and serving as unit circuit sections correspond to the inspection circuits 6e of the active matrix substrate 20a of the first embodiment, and the other part of the configuration of the active matrix substrate 20b is substantially the same as that of the active matrix substrate 20a of the first embodiment.

As described above, in a manner similar to the first embodiment, in the active matrix substrate 20b of this embodiment, the arrangement pitch of outer ones of the second unit circuits 6u constituting the peripheral circuit section 6 is larger than that of inner ones of the second unit circuits 6u. Thus, in the active matrix substrate 20b with the three-side-free structure, the width of a frame region F along a terminal region T can be minimized Third Embodiment FIG. 16 is a plan view of an active matrix substrate 20c according to a third embodiment.

The second embodiment is directed to the active matrix substrate 20b in which only the inspection circuits are provided in the peripheral circuit section 6. On the other hand, in the third embodiment, an active matrix substrate 20c includes a peripheral circuit section 9 in which only protection circuits are provided.

Figure 16:
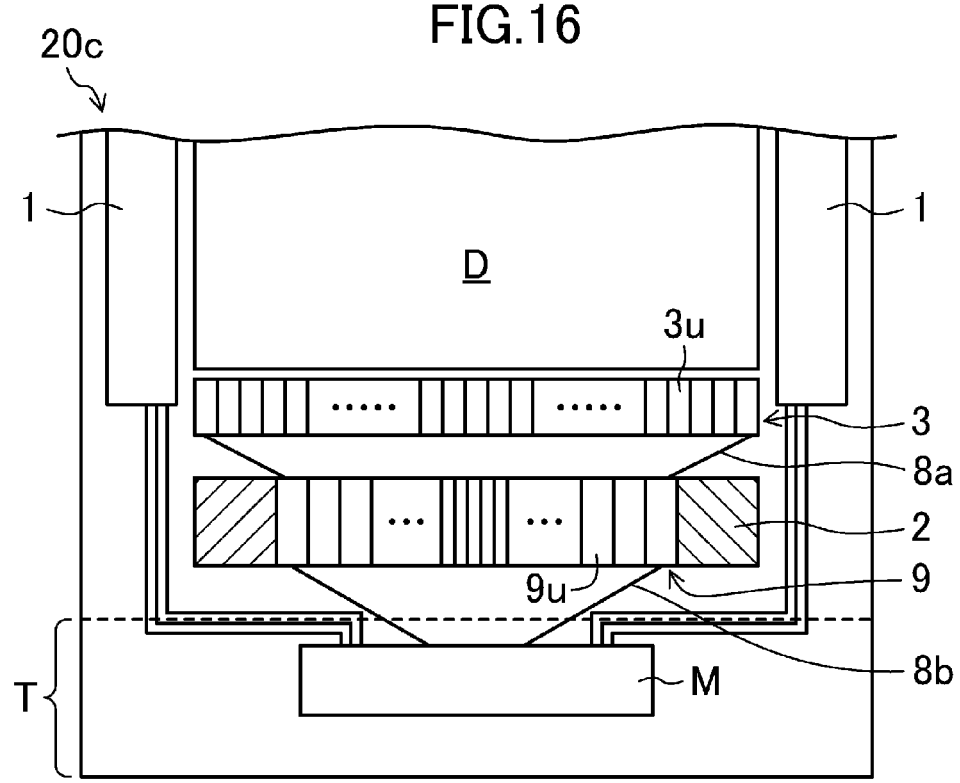
FIG. 16 is a plan view of an active matrix substrate according to a third embodiment.

As illustrated in FIG. 16, in the active matrix substrate 20c, second unit circuits 9u constituting the peripheral circuit section 9 and serving as unit circuit sections correspond to the protection circuits 9e of the active matrix substrate 20a of the first embodiment, and the other part of the configuration of the active matrix substrate 20c is substantially the same as that of the active matrix substrate 20a of the first embodiment.

As described above, in a manner similar to the first and second embodiments, in the active matrix substrate 20c of the third embodiment, the arrangement pitch of outer ones of the second unit circuits 9u constituting the peripheral circuit section 9 is larger than inner ones of the second unit circuits 9u. Thus, in the active matrix substrate 20c with the three-side-free structure, the width of a frame region F along a terminal region T can be minimized Fourth Embodiment FIG. 17 is a plan view of an active matrix substrate 20d according to a fourth embodiment.

The foregoing embodiments are directed to the active matrix substrates 20a, 20b, and 20c in each of which one peripheral circuit section 4, 6, or 9 is provided between the demultiplexer circuit section 3 and the mount region M. On the other hand, the fourth embodiment is directed to an active matrix substrate 20d in which two peripheral circuit sections are provided between a demultiplexer circuit section 3 and a mount region M.

Figure 17:
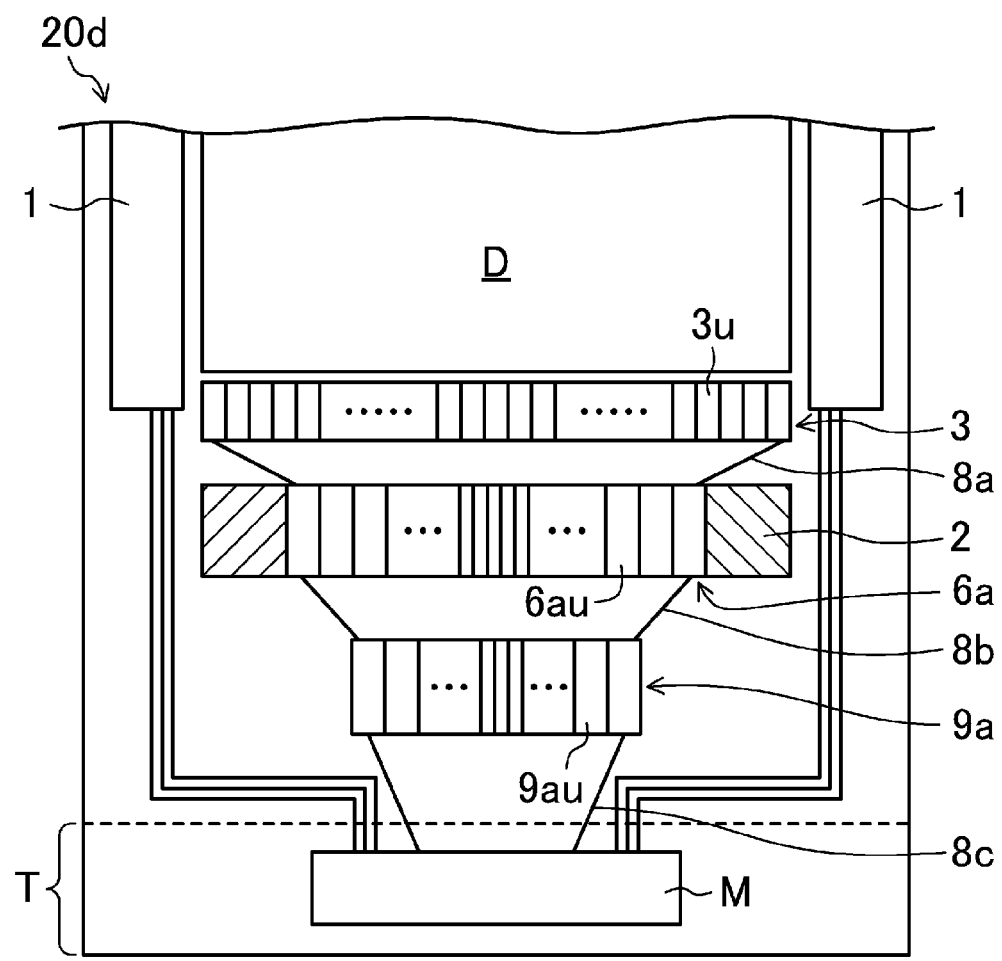
FIG. 17 is a plan view of an active matrix substrate according to a fourth embodiment.

As illustrated in FIG. 17, in the active matrix substrate 20d, a first peripheral circuit section 6a is provided in a frame region F between the demultiplexer circuit section 3 and the mount region M. As illustrated in FIG. 17, the first peripheral circuit 6a includes, as a plurality of first unit circuit sections, a plurality of second unit circuits 6au aligned along one side (i.e., the bottom side in FIG. 17) of a display region D. In addition, as illustrated in FIG. 17, accessory wiring circuits 2 such as a level shift circuit, a buffer circuit, a protection circuit for a general signal, a control signal line for a demultiplexer circuit, and a protection circuit for the control signal are monolithically provided near the first peripheral circuit section 6a. The arrangement pitch of outer ones of the second unit circuits 6au is larger than that of inner ones of the second unit circuits 6au. The second unit circuits 6au are substantially the same as the inspection circuits 6e of the active matrix substrate 20a of the first embodiment.

As illustrated in FIG. 17, in the active matrix substrate 20d, a second peripheral circuit section 9a is provided in part of the frame region F between the first peripheral circuit section 6a and the mount region M. As illustrated in FIG. 17, the second peripheral circuit 9a includes, as a plurality of second unit circuit sections, a plurality of third unit circuits 9au aligned along one side (i.e., the bottom side in FIG. 17) of the display region D. The arrangement pitch of outer ones of the third unit circuit 9au is larger than that of inner ones of the third unit circuit 9au. The third unit circuits 9au are substantially the same as the protection circuits 9e of the active matrix substrate 20a of the first embodiment.

As illustrated in FIG. 17, the second unit circuits 6au are individually connected to the first unit circuits 3u through a plurality of first video signal lines 8a serving as a plurality of first lines.

As illustrated in FIG. 17, the third unit circuits 9au are individually connected to the second unit circuits 6au through a plurality of second video signal lines 8b serving as a plurality of second lines.

As illustrated in FIG. 17, the second video signal lines 8b are arranged such that the outline of the second video signal lines 8b narrows from the second unit circuits 6au toward the third unit circuits 9au.

As illustrated in FIG. 17, the third unit circuits 9au are connected to a plurality of terminals (7) on the mount region M through a plurality of third video signal lines 8c serving as a plurality of third lines.

As illustrated in FIG. 17, the third video signal lines 8c are arranged such that the outline of the third video signal lines 8c narrows from the third unit circuits 9au toward the mount region M.

As described above, in the active matrix substrate 20d of this embodiment, in the frame region F along the terminal region T near the substrate end in the frame region F defined around the rectangular display region D, the first peripheral circuit section 6a and the second peripheral circuit section are provided between the demultiplexer circuit section 3 near the display region D and the mount region M that is a part of the terminal region T. In the first peripheral circuit section 6a and the second peripheral circuit section, the monolithically provided second unit circuits 6au are aligned, and the monolithically provided third unit circuits 9au are also aligned, along one side of the display region D. The arrangement pitch of the outer second unit circuits 6au is larger than that of the inner second unit circuits 6au, and the arrangement pitch of the outer third unit circuits 9au is larger than the inner third unit circuits 9au. Thus, suppose that the length of the first peripheral circuit section 6a along one side of the display region D is common, the number of second unit circuits 6au included in the first peripheral circuit section 6a is common, the length of the second peripheral circuit 9a along the side of the display region D is common, and the number of third unit circuits 9au included in the second peripheral circuit section 9a is common, for example, then the narrowing of the outlines of the second video signal lines 8b and the third video signal lines 8c becomes gentle, i.e., the angle formed by each of the outermost second video signal lines 8b and the outermost third video signal line 8c with the side of the display region D is reduced, as compared to a case where the arrangement pitches of the second unit circuit and the third unit circuit are uniform at an average value. In this manner, the lengths of the outlines of the second video signal lines 8b and the third video signal lines 8c in a direction perpendicular to the side of the display region D is reduced. As a result, the width of the frame region F along the terminal region T can be minimized in the active matrix substrate 20d with the three-side-free structure.

In addition, in the active matrix substrate 20d of this embodiment, the length of the first peripheral circuit section 6a along one side of the display region D is smaller than that of the demultiplexer circuit section 3 along the side of the display region D, and is larger than that of the second peripheral circuit section 9a along the side of the display region D. Thus, it is possible to obtain a sufficient space for disposing other circuits and lines such as a level shift circuit, a buffer circuit, a protection circuit for a general signal, a control signal line for a demultiplexer circuit, and a protection circuit for a control signal near the both ends of each of the first peripheral circuit section 6a and the second peripheral circuit section 9a.

In the active matrix substrate 20d of this embodiment, the arrangement pitch of the outer second unit circuits 6au is larger than that of the inner second unit circuits 6au, and the arrangement pitch of the outer third unit circuits 9*au* is larger than that of the inner third unit circuits 9*au*. Alternatively, the arrangement pitch of the outer second unit circuits 6*au* or the third unit circuits 9*au* may be larger than that of the inner second unit circuits 6*au* or the third unit circuits 9*au*.

Fifth Embodiment

Figure 18:
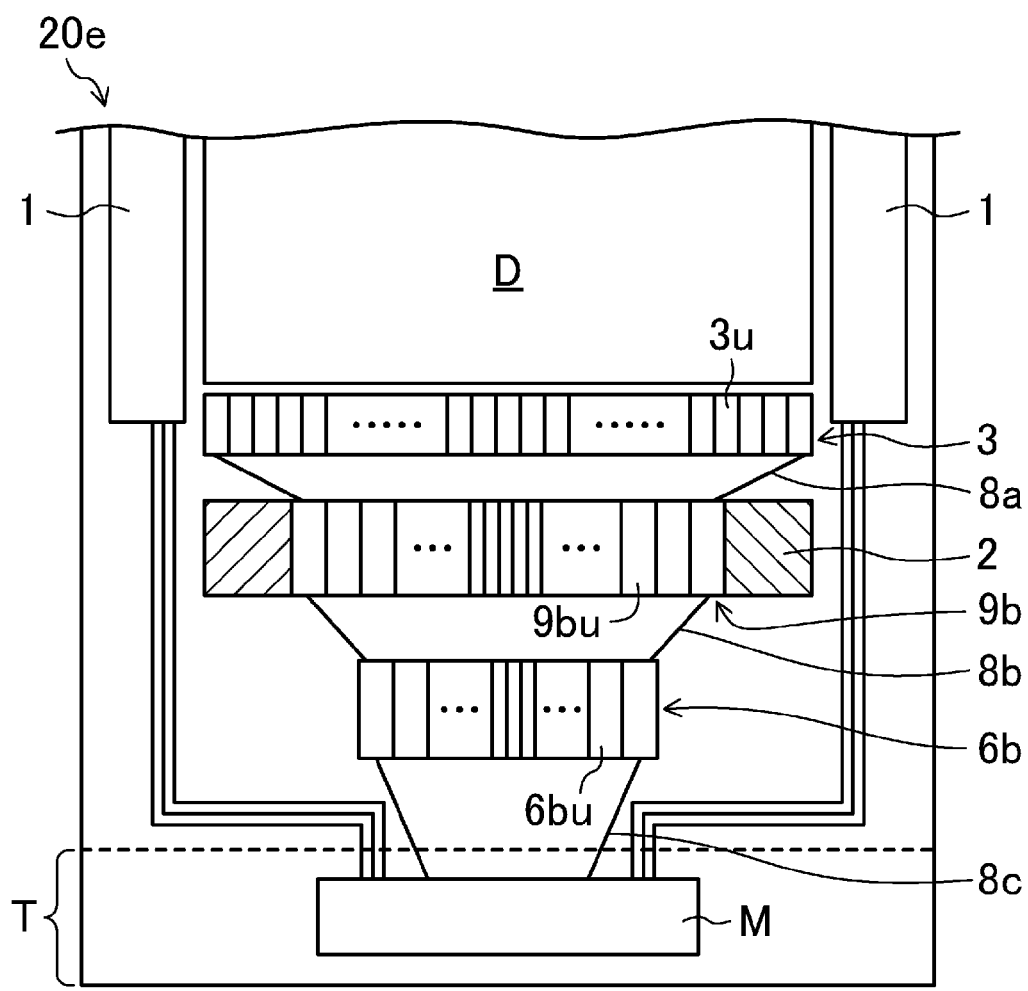
FIG. 18 is a plan view of an active matrix substrate according to a fifth embodiment.

FIG. 18 is a plan view of an active matrix substrate 20*e* according to a fifth embodiment.

The fourth embodiment is directed to the active matrix substrate 20*d* in which the first peripheral circuit section 6*a* serving as an inspection circuit and the second peripheral circuit section 9*a* serving as a protection circuit are disposed in this order from the demultiplexer circuit section 3 between the demultiplexer circuit section 3 and the mount region M. On the other hand, the fifth embodiment is directed to the active matrix substrate 20*e* in which a first peripheral circuit section 9*b* serving as a protection circuit and a second peripheral circuit section 6*b* serving as an inspection circuit are disposed in this order from a demultiplexer circuit section 3 between the demultiplexer circuit section 3 and a mount region M.

As illustrated in FIG. 18, in the active matrix substrate 20*e*, the first peripheral circuit section 9*b* is provided in a frame region F between the demultiplexer circuit section 3 and the mount region M. As illustrated in FIG. 18, the first peripheral circuit 9*b* includes, as a plurality of first unit circuit sections, a plurality of second unit circuits 9*bu* aligned along one side (i.e., the bottom side in FIG. 18) of a display region D. In addition, as illustrated in FIG. 18, accessory wiring circuits 2 such as a level shift circuit, a buffer circuit, a protection circuit for a general signal, a control signal line for a demultiplexer circuit, and a protection circuit for the control signal are monolithically provided near the first peripheral circuit section 9*b*. The arrangement pitch of outer ones of the second unit circuits 9*bu* is larger than that of inner ones of the second unit circuits 9*bu*. The second unit circuits 9*bu* are substantially the same as the protection circuit 9*e* of the active matrix substrate 20*a* of the first embodiment.

As illustrated in FIG. 18, in the active matrix substrate 20*e*, the second peripheral circuit section 6*b* is provided in part of the frame region F between the first peripheral circuit section 9*b* and the mount region M. As illustrated in FIG. 18, the second peripheral circuit 6*b* includes, as a plurality of second unit circuit sections, a plurality of third unit circuits 6*bu* aligned along one side (i.e., the bottom side in FIG. 18) of the display region D. The arrangement pitch of outer ones of the third unit circuits 6*bu* is larger than that of inner ones of the third unit circuits 6*bu*. The third unit circuit 6*bu* is substantially the same as the inspection circuits 6*e* of the active matrix substrate 20*a* of the first embodiment.

As illustrated in FIG. 18, the second unit circuits 9*bu* are individually connected to the first unit circuits 3*u* through a plurality of first video signal lines 8*a* serving as a plurality of first lines.

As illustrated in FIG. 18, the third unit circuits 6*bu* are individually connected to the second unit circuits 9*bu* through a plurality of second video signal lines 8*b* serving as a plurality of second lines.

As illustrated in FIG. 18, the second video signal lines 8*b* are arranged such that the outline of the second video signal lines 8*b* narrows from the second unit circuits 9*bu* toward the third unit circuits 6*bu*.

As illustrated in FIG. 18, the third unit circuits 6*bu* are connected to a plurality of terminals (7) on the mount region M through a plurality of third video signal lines 8*c* serving as a plurality of third lines.

As illustrated in FIG. 18, the third video signal lines 8*c* are arranged such that the outline of the third video signal lines 8*c* narrows from the third unit circuits 6*bu* toward the mount region M.

As described above, in a manner similar to the fourth embodiment, in the active matrix substrate 20*e* of this embodiment, the arrangement pitch of outer ones of the second unit circuits 9*bu* constituting the first peripheral circuit section 9*b* is larger than that of inner ones of the second unit circuits 9*bu*, and the arrangement pitch of outer ones of the third unit circuits 6*bu* constituting the second peripheral circuit section 6*b* is larger than that of inner ones of the third unit circuits 6*bu*. Thus, in the active matrix substrate 20*e* with the three-side-free structure, the width of the frame region F along the terminal region T can be minimized.

In the active matrix substrate 20*e* of this embodiment, the arrangement pitch of the outer second unit circuits 9*bu* is larger than that of the inner second unit circuits 9*bu*, and the arrangement pitch of the outer third unit circuits 6*bu* is larger than that of the inner third unit circuits 6*bu*. Alternatively, the arrangement pitch of the outer second unit circuits 9*bu* or the third unit circuits 6*bu* may be larger than that of the inner second unit circuits 9*bu* or the third unit circuits 6*bu*.

The foregoing embodiments are directed to the active matrix substrates in each of which the demultiplexer circuit is monolithically provided in the frame region. The present invention is also applicable to an active matrix substrate including no demultiplexer circuit, i.e., an active matrix substrate that directly drives a source signal by using a driver IC.

The foregoing embodiments are directed to the active matrix substrates in each of which the width of the source-side part of the frame region F is reduced. The present invention is also applicable to an active matrix substrate in which the width of a gate-side portion of the frame region F is reduced.

The foregoing embodiments are directed to the active matrix substrates in each of which the line arrangement is symmetric with respect to the center line C of the display region D. The present invention is also applicable to an active matrix substrate with a line arrangement that is asymmetric with respect to the center line C of a display region D.

In the foregoing embodiments, the liquid crystal display panel is used as an example of a display panel. The present invention is also applicable to other display panels such as organic electro luminescence (EL) display panels, inorganic EL display panels, plasma display panels, and electronic paper, and also to large display panels to be used as monitors, such as television screens and electronic signboards, as well as display panels for mobile use that needs reduction in panel size.

The foregoing embodiments are directed to liquid crystal display panels in which each pixel has three subpixels (e.g., red, green, and blue). The present invention is also applicable to display panels in which each pixel has four or more subpixels (e.g., red, green, blue, and yellow, or red, green, blue, and white).

In the foregoing embodiments, each of the active matrix substrates uses electrodes of the TFTs connected to the pixel electrodes as drain electrodes. The present invention is also applicable to active matrix substrates in which electrodes of TFTs connected to pixel electrodes are used as source electrodes.

INDUSTRIAL APPLICABILITY

As described above, the present invention can minimize the width of a frame region along a terminal region in an active matrix substrate with a three-side-free structure, and thus, the present invention is useful for display panels included in mobile electronic equipment.

DESCRIPTION OF REFERENCE CHARACTERS

D display region
F frame region
M mount region
T terminal region
3 demultiplexer circuit section
3u first unit circuit
4 peripheral circuit section
4u, 4ua, 4ub second unit circuit (unit circuit section)
6 peripheral circuit section
6a first peripheral circuit section
6au second unit circuit (first unit circuit section)
6u second unit circuit (unit circuit section)
6b second peripheral circuit section
6bu third unit circuit (second unit circuit section)
6e inspection circuit
8 video signal line
8a first video signal line (first line)
8b second video signal line (second line)
8c third video signal line (third line)
9 peripheral circuit section
9a second peripheral circuit section
9au third unit circuit (second unit circuit section)
9b first peripheral circuit section
9bu second unit circuit (first unit circuit section)
9u second unit circuit (unit circuit section)
9e, 9ea-9ec protection circuit
16a source signal line
20, 20a-20e active matrix substrate
30 counter substrate
40 liquid crystal layer (display medium layer)
50 liquid crystal display panel

The invention claimed is:
1. An active matrix substrate comprising:
a rectangular display region in which an image is to be displayed;
a frame region defined around the display region;
a terminal region included in the frame region, defined along one side of the display region, and located near an end of the substrate;
a mount region included in the terminal region and defined along the side of the display region;
a plurality of signal lines located in the display region and extending in parallel with one another in a direction perpendicular to the side of the display region;
a peripheral circuit section located in a portion of the frame region between the display region and the mount region and including a plurality of unit circuit sections that are monolithically provided and are aligned along the side of the display region;
a plurality of first lines located in a portion of the frame region between the display region and the peripheral circuit section and having an outline that narrows from the signal lines toward the unit circuit sections; and
a plurality of second lines located in a portion of the frame region between the peripheral circuit section and the mount region and having an outline that narrows from the unit circuit sections toward the mount region, wherein
an arrangement pitch of outer ones of the unit circuit sections is larger than that of inner ones of the unit circuit sections.

2. The active matrix substrate of claim 1, further comprising:
a demultiplexer circuit section located in a portion of the frame region between the display region and the peripheral circuit section and including a plurality of first unit circuits that are monolithically provided for each predetermined number of adjacent ones of the signal lines and are aligned along the side of the display region, wherein
the first unit circuits are connected to the predetermined number of adjacent ones of the signal lines,
the unit circuit sections are a plurality of second unit circuits individually connected to the first unit circuits through the first lines,
the first lines are a plurality of first video signal lines that are arranged in a portion of the frame region between the demultiplexer circuit section and the peripheral circuit section such that an outline of the first video signal lines narrows from the first unit circuits toward the second unit circuits, and
the second lines are a plurality of second video signal lines.

3. The active matrix substrate of claim 1, wherein
the signal lines are a plurality of source signal lines.

4. The active matrix substrate of claim 2, wherein
each of the second unit circuits includes at least one of an inspection circuit for inputting an inspection signal to an associated one of the first unit circuits or a protection circuit for protecting at least an associated one of the first unit circuits.

5. The active matrix substrate of claim 2, wherein
a length of the peripheral circuit section along the side of the display region is smaller than a length of the demultiplexer circuit section along the side of the display region.

6. A display panel comprising:
the active matrix substrate of claims 1;
a counter substrate facing the active matrix substrate; and
a display medium layer located between the active matrix substrate and the counter substrate.

7. The display panel of claim 6, wherein
the display medium layer is a liquid crystal layer.

8. An active matrix substrate comprising:
a rectangular display region in which an image is to be displayed;
a frame region defined around the display region;
a terminal region included in the frame region, defined along one side of the display region, and located near an end of the substrate;
amount region included in the terminal region and defined along the side of the display region;
a plurality of signal lines located in the display region and extending in parallel with one another in a direction perpendicular to the side of the display region;
a first peripheral circuit section located in a portion of the frame region between the display region and the mount region and including a plurality of first unit circuit sections that are monolithically provided and are aligned along the side of the display region;
a second peripheral circuit section located in a portion of the frame region between the first peripheral circuit section and the mount region and including a plurality of second unit circuit sections that are monolithically provided, are individually connected to the first unit circuit sections, and are aligned along the side of the display region;

a plurality of first lines located in a portion of the frame region between the display region and the first peripheral circuit section and having an outline that narrows from the signal lines toward the first unit circuit sections;

a plurality of second lines located in a portion of the frame region between the first peripheral circuit section and the second peripheral circuit section and having an outline that narrows from the first unit circuit sections toward the second unit circuit sections; and a plurality of third lines located in a portion of the frame region between the second peripheral circuit section and the mount region and having an outline that narrows from the second unit circuit sections toward the mount region, wherein an arrangement pitch of outer ones of the first unit circuit sections is larger than that of inner ones of the first unit circuit sections, and/or an arrangement pitch of outer ones of the second unit circuit sections is larger than that of inner ones of the second unit circuit sections.

9. The active matrix substrate of claim 8, further comprising:

a demultiplexer circuit section located in a portion of the frame region between the display region and the first peripheral circuit section and including a plurality of first unit circuits that are monolithically provided for each predetermined number of adjacent ones of the signal lines and are aligned along the side of the display region, wherein the first unit circuits are connected to the predetermined number of adjacent ones of the signal lines, the first unit circuit sections are a plurality of second unit circuits individually connected to the first unit circuits through the first lines, the second unit circuit sections are a plurality of third unit circuits individually connected to the second unit circuits through the second lines, the first lines are a plurality of first video signal lines that are arranged in a portion of the frame region between the demultiplexer circuit section and the first peripheral circuit section such that an outline of the first video signal lines narrows from the first unit circuits toward the second unit circuits, the second lines are a plurality of second video signal lines that are arranged in a portion of the frame region between the first peripheral circuit section and the second peripheral circuit section such that an outline of the second video signal lines narrows from the second unit circuits toward the third unit circuits, and the third lines are a plurality of third video signal lines.

10. The active matrix substrate of claim 8, wherein the signal lines are a plurality of source signal lines.

11. The active matrix substrate of claim 9, wherein each of the second unit circuits is an inspection circuit for inputting an inspection signal to an associated one of the first unit circuits, and each of the third unit circuits is a protection circuit for protecting at least an associated one of the first unit circuits.

12. The active matrix substrate of claim 9, wherein each of the second unit circuits is a protection circuit for protecting at least an associated one of the first unit circuits, and each of the third unit circuits is an inspection circuit for inputting an inspection signal to an associated one of the first unit circuits.

13. The active matrix substrate of claim 9, wherein a length of the first peripheral circuit section along the side of the display region is smaller than a length of the demultiplexer circuit section along the side of the display region, and is larger than a length of the second peripheral circuit section along the side of the display region.

\* \* \* \* \*